US007825881B2

(12) United States Patent
Shin

(10) Patent No.: US 7,825,881 B2
(45) Date of Patent: Nov. 2, 2010

(54) ORGANIC LIGHT EMITTING DISPLAY DEVICE

(75) Inventor: Dong-Yong Shin, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 937 days.

(21) Appl. No.: 11/698,713

(22) Filed: Jan. 25, 2007

(65) Prior Publication Data

US 2008/0030439 A1 Feb. 7, 2008

(30) Foreign Application Priority Data

Aug. 1, 2006 (KR) .................... 10-2006-0072653

(51) Int. Cl.
 *G09G 3/32* (2006.01)
(52) U.S. Cl. .............................. 345/82; 345/76; 345/87; 345/92
(58) Field of Classification Search ................... 345/39, 345/42, 44–46, 76–78, 81–88, 90–92, 95, 345/100, 204, 214; 315/169.3
See application file for complete search history.

(56) References Cited

U.S. PATENT DOCUMENTS

| 7,705,840 B2* | 4/2010 | Wei et al. ..................... 345/204 |
| 2003/0193490 A1* | 10/2003 | Liu et al. ..................... 345/204 |
| 2004/0251953 A1* | 12/2004 | Yamazaki et al. ........... 327/512 |
| 2007/0018918 A1* | 1/2007 | Chung .......................... 345/76 |
| 2007/0046608 A1* | 3/2007 | Chung .......................... 345/92 |

* cited by examiner

*Primary Examiner*—Richard Hjerpe
*Assistant Examiner*—Mansour M Said
(74) *Attorney, Agent, or Firm*—Christie, Parker & Hale, LLP

(57) ABSTRACT

An organic light emitting display device includes data lines, selection scan lines, and emission scan lines for transmitting data signals, selection signals, and emission signals, respectively. Pixel circuits are arranged at regions defined by the data lines and the selection scan lines. A first scan driving unit outputs the emission signals. The first scan driving unit includes conversion circuits, each of the conversion circuits including conversion circuit transistors of an identical channel type. Each of the conversion circuits receives a first signal, a second signal, a third signal and a conversion circuit clock signal, and outputs a conversion output signal as a respective emission signal of the emission signals.

23 Claims, 15 Drawing Sheets

ORGANIC LIGHT EMITTING DISPLAY DEVICE

CROSS-REFERENCE TO RELATED PATENT APPLICATION

This application claims priority to and the benefit of Korean Patent Application No. 10-2006-0072653, filed on Aug. 1, 2006, in the Korean Intellectual Property Office, the entire content of which is incorporated herein by reference.

BACKGROUND OF THE INVENTION

1. Field of the Invention

The present invention relates to an organic light emitting display device, and more particularly, to an organic light emitting display device which uses transistors of an identical channel type in a driving device and produces stable emission signals.

2. Description of the Related Art

General organic light emitting display devices, emitting light by electrically exciting a fluorescent organic compound, are designed to display images by voltage- or current-programming a plurality of organic light emitting cells arranged in a matrix. The organic light-emitting cells have diode characteristics, so they are commonly referred to as organic light emitting diodes (OLEDs).

FIG. 1 is a conceptual diagram of an organic light emitting element. Referring to FIG. 1, the organic light emitting element includes an anode which is formed of indium tin oxide (ITO), an organic layer, and a cathode layer which is formed of metal. The organic layer includes an emission material layer (EML), an electron transporting layer (ETL), and a hole transporting layer (HTL).

An organic light emitting cell having an organic light emitting element may be driven by a passive matrix driving method or an active matrix driving method that uses a thin film transistor (TFT) or a MOSFET. In the passive matrix driving method, a line is selected, and a corresponding pixel between an anode and a cathode that overlap each other is driven. In the active matrix driving method, ITO pixel electrodes to which TFTs are connected are driven according to voltages kept in capacitors connected to gates of the TFTs. An active matrix driving method may be categorized as a voltage programming method or a current programming method according to the type of a signal that is applied to store and keep the voltages in the capacitors.

FIG. 2 is a circuit diagram of a pixel circuit to be driven by a conventional voltage programming method. Referring to FIG. 2, a switching transistor M22 is turned on according to a selection signal of a selection scan line Sn, a data voltage from a data line Dm is applied to a gate of a driving transistor M21 via the switching transistor M22, and a difference in potential between the data voltage and a voltage source VDD is stored in a capacitor C21 connected between a source and the gate of the driving transistor M21. Due to the difference in potential, a driving current $I_{OLED}$ flows into an OLED, and thus the OLED emits light. Various gray levels can be displayed by varying the level of the applied data voltage. However, a pixel circuit driven by a conventional voltage programming method may not be able to provide a high gray level because corresponding driving transistors M21 of different pixels may have different threshold voltages and different electron mobilities due to a non-uniform manufacture of the driving transistors.

To overcome this problem, pixel circuits based on a current programming method are used. Substantially identical current sources for supplying currents to the pixel circuits are arranged on the entire surface of a panel (that is, in all data lines of the panel), so that an image of uniform brightness is displayed even when driving transistors of different pixels have different voltage-current characteristics.

FIG. 3 is a circuit diagram of a pixel circuit to be driven by a conventional current programming method. Referring to FIG. 3, when transistors M32 and M33 are turned on according to a selection signal of a selection scan line Sn, a p-channel transistor M31 enters into a diode connection state, so that a current flows across a capacitor C31 and a voltage is stored therein. A gate potential of the transistor M31 is lowered, so that a current flows from a source of the transistor M31 to a drain thereof. When the voltage stored in capacitor C31 increases over time and thus the drain current of the transistor M31 becomes equal to that of the transistor M32, the flow of current across the capacitor C31 is stopped, so that the stored voltage is stabilized. Then, the selection signal of the selection scan line Sn becomes logic high, and thus the transistors M32 and M33 are turned off. However, an emission signal of an emission scan line En becomes logic low, so that a transistor M34 is turned on. Then, power from a voltage source VDD is supplied to the pixel circuit, and a driving current $I_{OLED}$ corresponding to the voltage stored in the capacitor C31 flows into an OLED, so that the OLED emits light with a certain brightness.

In order to drive a pixel circuit according to the conventional current programming method as illustrated in FIG. 3, a driving device for supplying a signal to a selection scan line and a driving device for supplying a signal to an emission scan line are required. In a conventional organic light emitting display device, different channel types of CMOS transistors are used in the driving devices for supplying signals to the selection scan line and the emission scan line. The use of the different channel types of CMOS transistors complicates the manufacture of the display device and increases manufacturing costs.

SUMMARY OF THE INVENTION

An aspect of the present invention provides an organic light emitting display device which uses transistors of an identical channel type in a driving device so as to reduce manufacturing costs and is able to stably vary pulse widths of emission signals.

According to a first embodiment of the present invention, an organic light emitting display device includes a plurality of data lines for transmitting a plurality of data signals, a plurality of selection scan lines for transmitting a plurality of selection signals, and a plurality of emission scan lines for transmitting a plurality of emission signals. A plurality of pixel circuits are arranged at regions defined by the data lines and the selection scan lines. A first scan driving unit outputs the emission signals. The first scan driving unit includes a plurality of conversion circuits, each of the conversion circuits including a plurality of conversion circuit transistors of an identical channel type. Each of the conversion circuits receives a first signal, a second signal, a third signal, and a conversion circuit clock signal and outputs a conversion output signal as a respective emission signal of the emission signals. When the conversion circuit clock signal and the first signal are enable, the conversion output signal is disable. When the conversion circuit clock signal, the first signal, and the third signal are disable and the second signal is enable, the conversion output signal is disable. When the conversion circuit clock signal, the first signal, and the third signal are enable, the conversion output signal is disable. When the first signal is disable and the conversion circuit clock signal and the third signal are enable, the conversion output signal is enable.

According to a second embodiment of the present invention, an organic light emitting display device includes a plurality of data lines for transmitting a plurality of data signals, a plurality of selection scan lines for transmitting a plurality of selection signals, and a plurality of emission scan lines for transmitting a plurality of emission signals. A plurality of pixel circuits are arranged at regions defined by the data lines and the selection scan lines. A first scan driving unit outputs the emission signals. The first scan driving unit includes a plurality of conversion circuits, each of the conversion circuits including a plurality of conversion circuit transistors of an identical channel type. Each of the conversion circuits receives a first signal, a second signal, and a conversion circuit clock signal and outputs a conversion output signal as a respective emission signal of the emission signals. When the conversion circuit clock signal and the first signal are enable, the conversion output signal is disable. When the conversion circuit clock signal and the first signal are disable and the second signal is enable, the conversion output signal is disable. When the first signal is disable and the conversion circuit clock signal is enable, the conversion output signal is enable.

According to a third embodiment of the present invention, an organic light emitting display device includes a plurality of data lines for transmitting a plurality of data signals, a plurality of selection scan lines for transmitting a plurality of selection signals, and a plurality of emission scan lines for transmitting a plurality of emission signals. A plurality of pixel circuits are arranged at regions defined by the data lines and the selection scan lines. A first scan driving unit outputs the emission signals. The first scan driving unit includes a plurality of conversion circuits, each of the conversion circuits including a plurality of conversion circuit transistors of an identical channel type. Each of the conversion circuits receives a first signal, a conversion circuit clock signal, and a clock bar signal and outputs a conversion output signal as a respective emission signal of the emission signals. When the conversion circuit clock signal and the first signal are enable, the conversion output signal is disable. When the conversion circuit clock signal and the first signal are disable and the clock bar signal is enable, the conversion output signal is disable. When the first signal is disable and the conversion circuit clock signal is enable, the conversion output signal is enable.

According to a fourth embodiment of the present invention, an organic light emitting display device includes a plurality of data lines for transmitting a plurality of data signals, a plurality of selection scan lines for transmitting a plurality of selection signals, and a plurality of emission scan lines for transmitting a plurality of emission signals. A plurality of pixel circuits are arranged at regions defined by the data lines and the selection scan lines. A first scan driving unit outputs the emission signals. The first scan driving unit includes a plurality of conversion circuits, each of the conversion circuits including a plurality of conversion circuit transistors of an identical channel type. The conversion circuit receives a first signal, a conversion circuit clock signal, and a clock bar signal and outputs a conversion output signal as a respective emission signal of the emission signals. When the first signal is enable, the conversion output signal is disable. When the conversion circuit clock signal and the first signal are disable and the clock bar signal is enable, the conversion output signal is disable. When the first signal is disable and the conversion circuit clock signal is enable, the conversion output signal is enable.

In the first embodiment of the present invention, the first scan driving unit may further include a plurality of scan circuits, each of the scan circuits including a plurality of scan circuit transistors of an identical channel type. Each of the scan circuits receives an input signal, a scan circuit clock signal, and a clock bar signal and outputs a scan output signal. When the scan circuit clock signal is enable after the input signal is enable and the clock signal is disable, the scan output signal is enable. Scan output signals having sequential enable intervals are sent to a conversion circuit of the conversion circuits respectively as the first signal, the second signal, and the third signal.

In the second embodiment of the present invention, the first scan driving unit may further include a plurality of scan circuits, each of the scan circuits including a plurality of scan circuit transistors of an identical channel type. Each of the scan circuits receives an input signal, a scan circuit clock signal, and a clock bar signal and outputs a scan output signal. When the clock signal is enable after the input signal is enable and the clock signal is disable, the scan output signal is enable. Scan output signals having sequential enable intervals are sent to a conversion circuit of the conversion circuits respectively as the first signal and the second signal.

In the third embodiment of the present invention, the first scan driving unit may further include a plurality of scan circuits, each of the scan circuits including a plurality of scan circuit transistors of an identical channel type. Each of the scan circuits receives an input signal, a scan circuit clock signal, and a clock bar signal and outputs a scan output signal. When the scan circuit clock signal is enable after the input signal is enable and the clock signal is disable, the scan output signal is enable. The scan output signal is sent to a conversion circuit of the conversion circuits as the first signal.

In the fourth embodiment of the present invention, the first scan driving unit may further include a plurality of scan circuits, each of the scan circuits including a plurality of scan circuit transistors. Each of the scan circuits receives an input signal, a scan circuit clock signal, and a clock bar signal and outputs a scan output signal. When the scan circuit clock signal is enable after the input signal is enable and the clock signal is disable, the scan output signal is enable. The scan output signal is sent to a conversion circuit of the conversion circuits as the first signal.

In the first embodiment of the present invention, the plurality of conversion circuit transistors of each of the conversion circuits may include a first conversion circuit transistor for applying the first signal to a first node in response to the conversion circuit clock signal, a second conversion circuit transistor for applying a voltage of a first voltage source to a second node in response to a signal of the first node, a third conversion circuit transistor for applying a signal of the second node to a third node in response to the signal of the first node, a fourth conversion circuit transistor for applying a voltage of a second voltage source to the third node in response to a signal of a fourth node, a fifth conversion circuit transistor for applying the voltage of the second voltage source to the second node in response to a signal of the third node, a sixth conversion circuit transistor for applying the second signal to a fifth node in response to the second signal, a seventh conversion circuit transistor for applying the voltage of the first voltage source to the fifth node in response to the first signal, and an eighth conversion circuit transistor for applying the third signal to the fourth node in response to a signal of the fifth node. Each of the conversion circuits may further include a first capacitor for storing a difference in potential between the first node and the first voltage source, a second capacitor for storing a difference in potential between the second node and the third node, and a third capacitor for storing a difference in potential between the fourth node and the fifth node. The signal of the second node may be the conversion output signal.

In the second embodiment of the present invention, the plurality of conversion circuit transistors of each of the conversion circuits may include a first conversion circuit transistor for applying the first signal to a first node in response to the conversion circuit clock signal, a second conversion circuit transistor for applying a voltage of a first voltage source to a second node in response to a signal of the first node, a third conversion circuit transistor for applying a signal of the second node to a third node in response to the signal of the first node, a fourth conversion circuit transistor for applying a voltage of a second voltage source to the third node in response to a signal of a fourth node, a fifth conversion circuit transistor for applying the voltage of the second voltage source to the second node in response to a signal of the third node, a sixth conversion circuit transistor for applying the second signal to a fifth node in response to the second signal, a seventh conversion circuit transistor for applying the voltage of the first voltage source to the fifth node in response to the first signal, and an eighth conversion circuit transistor for applying the conversion circuit clock signal to the fourth node in response to a signal of the fifth node. Each of the conversion circuits may further include a first capacitor for storing a difference in potential between the first node and the first voltage source, a second capacitor for storing a difference in potential between the second node and the third node, and a third capacitor for storing a difference in potential between the fourth node and the fifth node. The signal of the second node may be the conversion output signal.

In the third embodiment of the present invention, the plurality of conversion circuit transistors of each of the conversion circuits may include a first conversion circuit transistor for applying the first signal to a first node in response to the conversion circuit clock signal, a second conversion circuit transistor for applying a voltage of a first voltage source to a second node in response to a signal of the first node, a third conversion circuit transistor for applying a signal of the second node to a third node in response to the signal of the first node, a fourth conversion circuit transistor for applying a voltage of a second voltage source to the third node in response to a signal of a fourth node, a fifth conversion circuit transistor for applying the voltage of the second voltage source to the second node in response to a signal of the third node, a sixth conversion circuit transistor for applying the clock bar signal to a fifth node in response to the clock bar signal, a seventh conversion circuit transistor for applying the voltage of the first voltage source to the fifth node in response to the first signal, and an eighth conversion circuit transistor for applying the conversion circuit clock signal to the fourth node in response to a signal of the fifth node. Each of the conversion circuits may further include a first capacitor for storing a difference in potential between the first node and the first voltage source, a second capacitor for storing a difference in potential between the second node and the third node, and a third capacitor for storing a difference in potential between the fourth node and the fifth node. The signal of the second node may be the conversion output signal.

In the fourth embodiment of the present invention, the plurality of conversion circuit transistors of each of the conversion circuits may include a first conversion circuit transistor for applying a voltage of a first voltage source to a first node in response to the first signal, a second conversion circuit transistor for applying a signal of the first node to a second node in response to the first signal, a third conversion circuit transistor for applying a voltage of a second voltage source to the second node in response to a signal of a third node, a fourth conversion circuit transistor for applying the voltage of the second voltage source to the first node in response to a signal of the second node, a fifth conversion circuit transistor for applying the clock bar signal to a fourth node in response to the clock bar signal, a sixth conversion circuit transistor for applying the voltage of the first voltage source to the fourth node in response to the first signal, and a seventh conversion circuit transistor for applying the conversion circuit clock signal to the third node in response to a signal of the fourth node. Each of the conversion circuits may further include a first capacitor for storing a difference in potential between the first node and the second node and a second capacitor for storing a difference in potential between the third node and the fourth node. The signal of the first node may be the conversion output signal.

The plurality of scan circuit transistors of each of the scan circuits in the first, second, third, or fourth embodiment may include a first scan circuit transistor for applying the input signal to a first node in response to the clock bar signal, a second scan circuit transistor having a second scan circuit transistor first electrode and a second scan circuit transistor gate electrode, the second scan circuit transistor being adapted to apply the scan circuit clock signal to a second node in response to a signal of the first node, a third scan circuit transistor for applying a voltage of a second voltage source to a third node in response to the clock bar signal, a fourth scan circuit transistor for applying the clock bar signal to the third node in response to the signal of the first node, and a fifth scan circuit transistor for applying a disable level of the first voltage source to the second node in response to a signal of the third node. Each of the scan circuits may further include a first scan circuit capacitor electrically connected between the second scan circuit gate electrode and the second scan circuit first electrode, the first scan circuit capacitor being adapted to store a difference in potential between an enable level of the signal of the first node and a disable level of the signal of the second node.

The organic light emitting display device as in the first, second, third, or fourth embodiment of the present invention may further include a second scan driving unit for outputting the selection signals. The second scan driving unit includes a plurality of selection circuits. Each of the selection circuits includes a plurality of selection circuit transistors of an identical channel type, receives a selection circuit input signal, a selection circuit clock signal and a selection circuit clock bar signal, and outputs a selection output signal as a respective selection signal of the selection signals. When the selection circuit clock signal is enable after the selection circuit input signal is enable and the selection circuit clock signal is disable, the selection output signal is enable.

The plurality of selection circuit transistors of each of the selection circuits may include a first selection circuit transistor for applying the selection circuit input signal to a first node in response to the selection circuit clock bar signal, a second selection circuit transistor having a second selection circuit transistor first electrode and a second selection circuit transistor gate electrode, the second selection circuit transistor being adapted to apply the selection circuit clock signal to a second node in response to a signal of the first node, a third selection circuit transistor for applying a voltage of a second voltage source to a third node in response to the selection circuit clock bar signal, a fourth selection circuit transistor for applying the selection circuit clock bar signal to the third node in response to the signal of the first node, and a fifth selection circuit transistor for applying a disable level of the first voltage source to the second node in response to a signal of the third node. Each of the selection circuits further includes a first selection circuit capacitor electrically connected between the second selection circuit transistor gate electrode and the second selection circuit first electrode, the first selection circuit capacitor being adapted to store a difference in potential between an enable level of the signal of the first node and a disable level of a signal of the second node.

In the first, second, third or fourth embodiment of the present invention, a first scan circuit of the scan circuits may receive a scan input signal as the input signal, receive a first control signal as the scan circuit clock signal, receive a second control signal as the clock bar signal, and output a first scan output signal of the scan output signals. A second scan circuit of the scan circuits may receive the first scan output signal as the input signal, receive the second control signal as the scan circuit clock signal, receive the first control signal as the clock bar signal, and output a second scan output signal of the scan output signals.

In the first or second embodiment of the present invention, a first conversion circuit of the conversion circuits may receive a first control signal as the conversion circuit clock signal and output a first emission output signal of the emission output signals, and a second conversion circuit of the conversion circuits may receive a second control signal as the conversion circuit clock signal and output a second emission output signal of the emission output signals.

In the third or fourth embodiment of the present invention, a first conversion circuit of the conversion circuits may receive a first control signal as the conversion circuit clock signal, receive a second control signal as the clock bar signal, and output a first emission output signal of the emission output signals. A second conversion circuit of the conversion circuits may receive the second control signal as the conversion circuit clock signal, receive the first control signal as the clock bar signal, and output a second emission output signal of the emission output signals.

In the first, second, third, or fourth embodiment of the present invention, a first selection circuit of the selection circuits may receive a selection input signal as the selection circuit input signal, receive a third control signal as the selection circuit clock signal, receive a fourth control signal as the selection circuit clock bar signal, and output a first selection output signal of the selection output signals. A second selection circuit of the selection circuits may receive the first selection output signal as the selection circuit input signal, receive the fourth control signal as the selection circuit clock signal, receive the third control signal as the selection circuit clock bar signal, and output a second selection output signal of the selection output signals.

In the first, second, third, or fourth embodiment of the present invention, the identical channel type may be a p-channel type.

In the first, second, third, or fourth embodiment of the present invention, the identical channel type may be an n-channel type.

In the first, second, third, or fourth embodiment of the present invention, the pixel circuits may transmit the data signals in response to the selection signals, store the data signals as third voltages, transmit driving currents corresponding to the third voltages in response to the emission signals, and drive organic light emitting diodes that emit lights in accordance with the driving currents.

Each of the pixel circuits may include an organic light emitting diode of the organic light emitting diodes, a driving transistor for supplying a driving current of the driving currents used to drive the organic light emitting diode, the driving transistor having a gate electrode and a first electrode. Each of the pixel circuits may further include a first switching device for applying a data signal of the data signals from a corresponding data line of the data lines to the driving transistor in response to a corresponding selection signal of the selection signals, a second switching device for connecting the driving transistor in a diode form in response to the selection signal, a first storage unit electrically connected between the first electrode and the gate electrode of the driving transistor, and a third switching device for applying the driving current from the driving transistor to the organic light emitting diode in response to a corresponding emission signal of the emission signals received from a corresponding emission scan line of the emission scan lines.

The organic light emitting display device as in the first, second, third, or fourth embodiment of the present invention may further include a plurality of load capacitors, each of the load capacitors being connected between a corresponding emission scan line of the emission scan lines and the second voltage source.

In the first, second, third, or fourth embodiment of the present invention, the second voltage source may be a ground terminal.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

Figure 1:
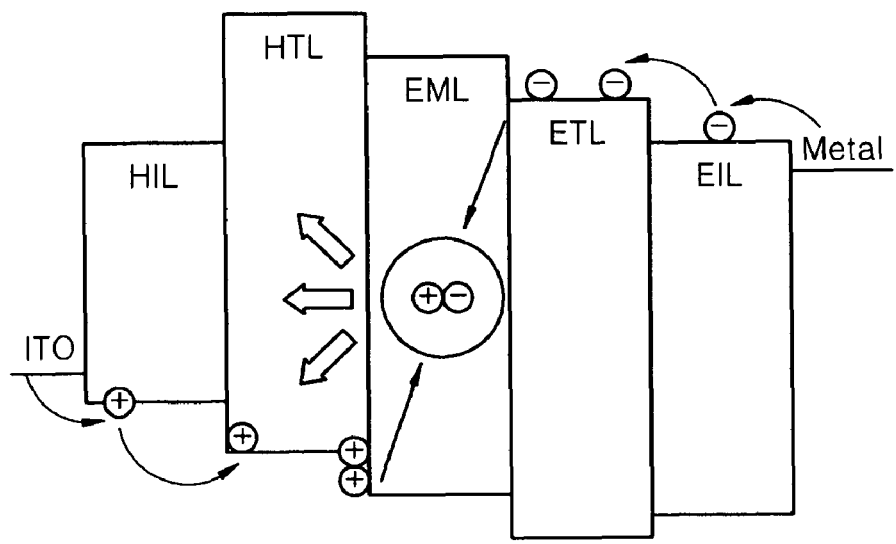
FIG. 1 is a conceptual diagram of a conventional organic light emitting element.
Figure 2:
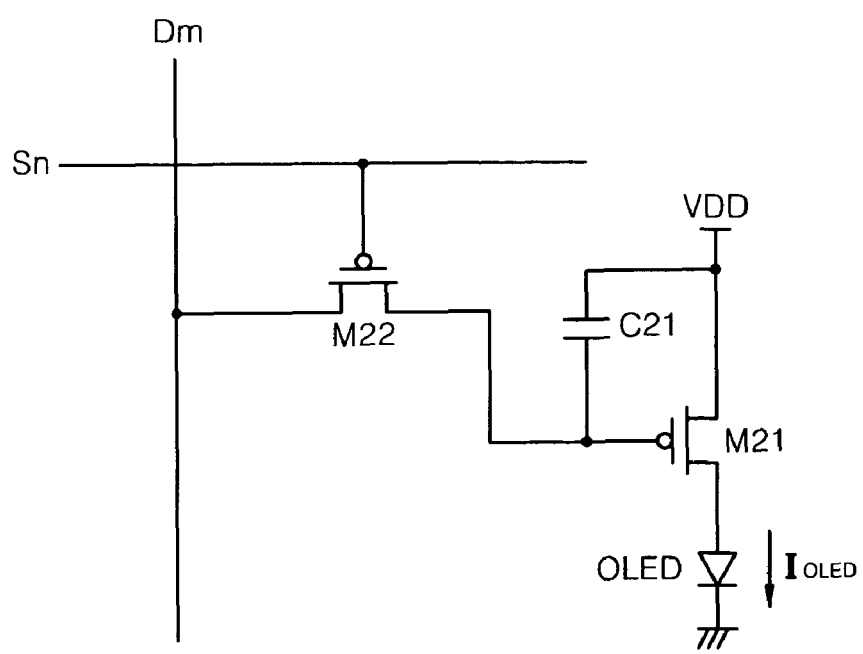
FIG. 2 is a circuit diagram of a pixel circuit to be driven by a conventional voltage programming method.
Figure 3:
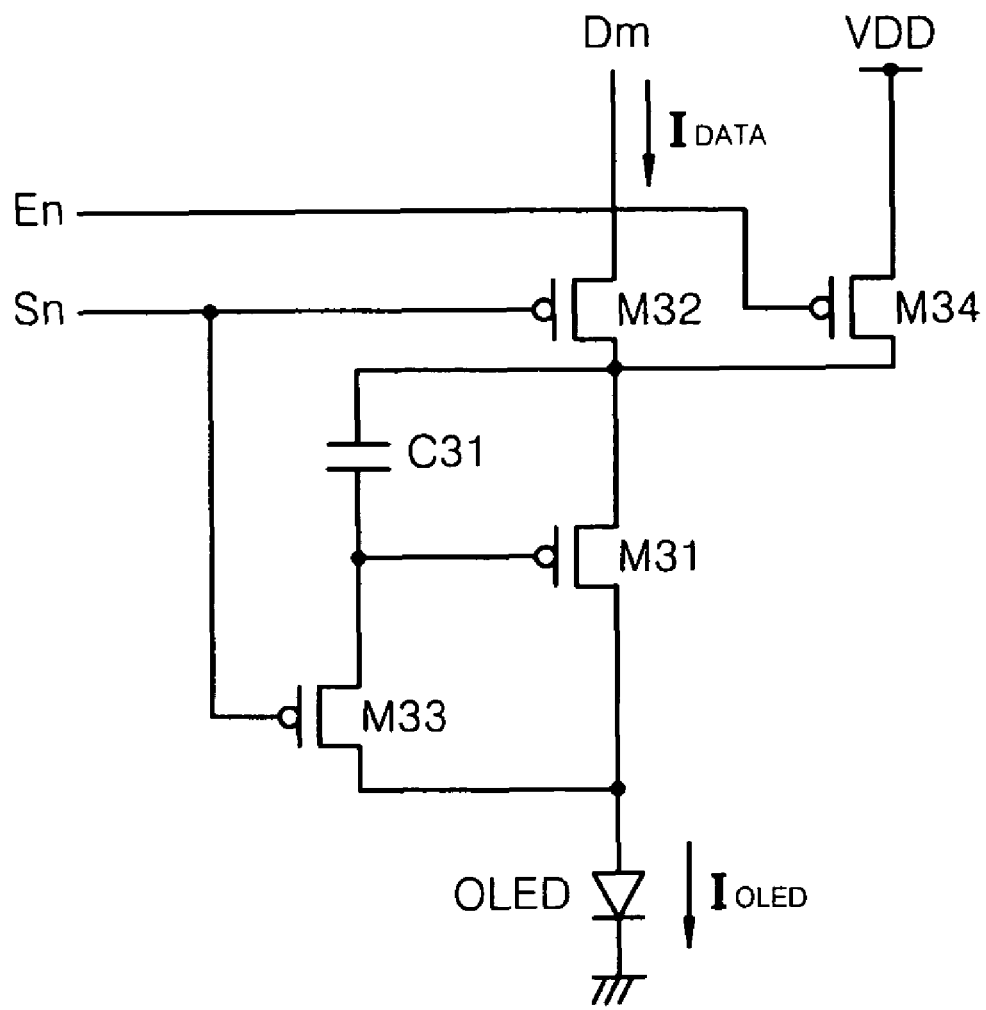
FIG. 3 is a circuit diagram of a pixel circuit to be driven by a conventional current programming method.
Figure 4:
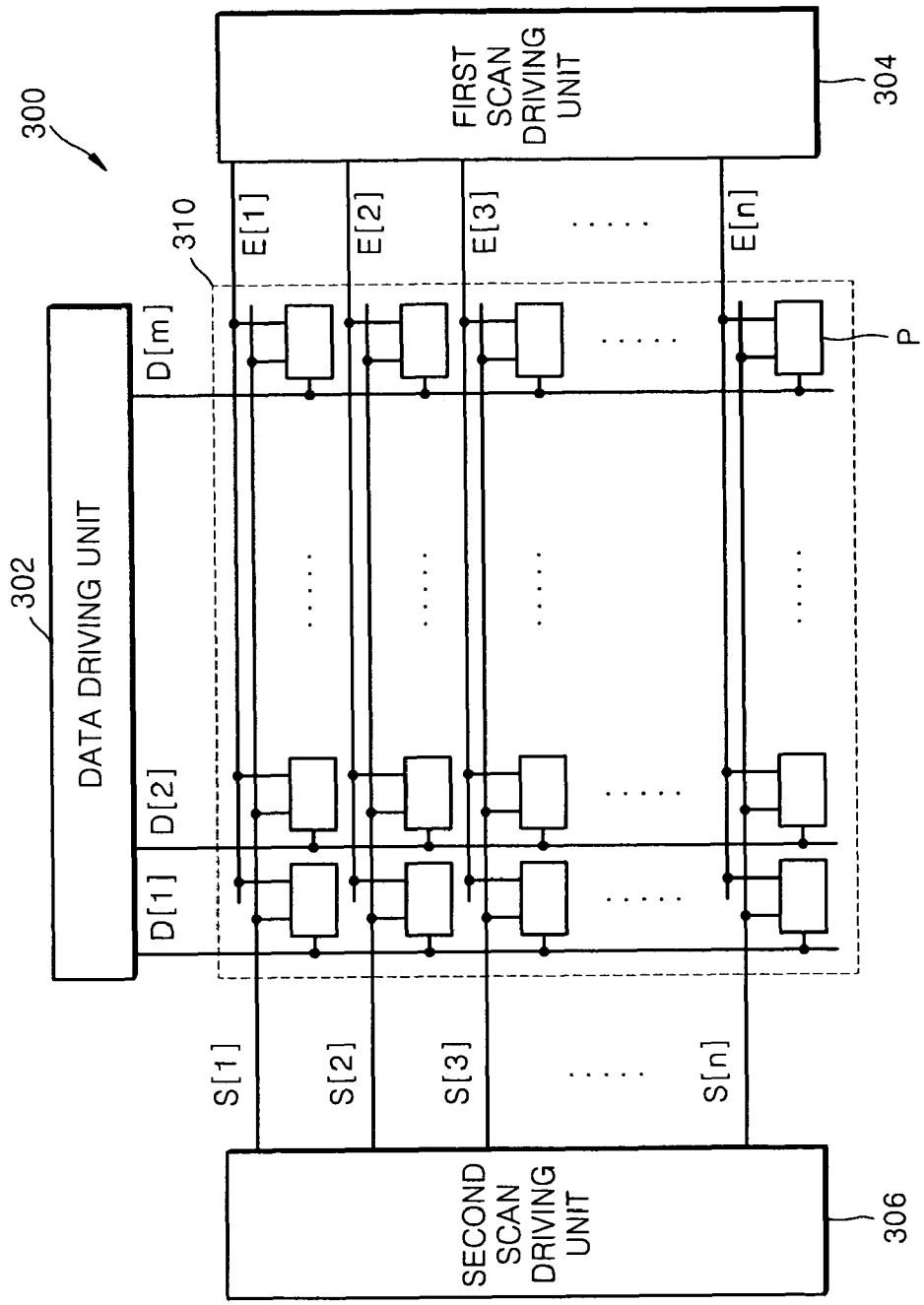
FIG. 4 shows an organic light emitting display device.

FIG. 4 shows an organic light emitting display device 300. Referring to FIG. 4, the organic light emitting display device 300 includes a data driving unit 302, a first scan driving unit 304, a second scan driving unit 306, and an organic light emitting display region 310.

The data driving unit 302 applies data signals D[1], D[2], . . . , and D[m] to data lines. Since pixel circuits of the organic light emitting display device 300 are driven by a current programming method, the data signals are output by a current source included in the data driving unit 302.

The first scan driving unit 304 applies emission signals E[1], E[2], . . . , and E[n] to emission scan lines. In response to the emission signals E[1], E[2], . . . , and E[n], driving currents are applied to organic light emitting diodes (OLEDs) included in pixel circuits P according to voltages stored in storage devices (e.g., capacitors) of the pixel circuits P. Accordingly, the OLEDs emit light.

The second scan driving unit 306 applies selection signals S[1], S[2], . . . , and S[n] to selection scan lines. The selection signals S[1], S[2], . . . , and S[n] are sequentially applied to the selection scan lines. According to the selection signals S[1], S[2], . . . , and S[n], the data signals D[1], D[2], . . . , and D[m] are applied to the pixel circuits P.

The organic light emitting display region 310 includes the pixel circuits P for driving a plurality of pixels. The pixels are arranged at regions defined by the selection scan lines and the data lines.

Figure 5:
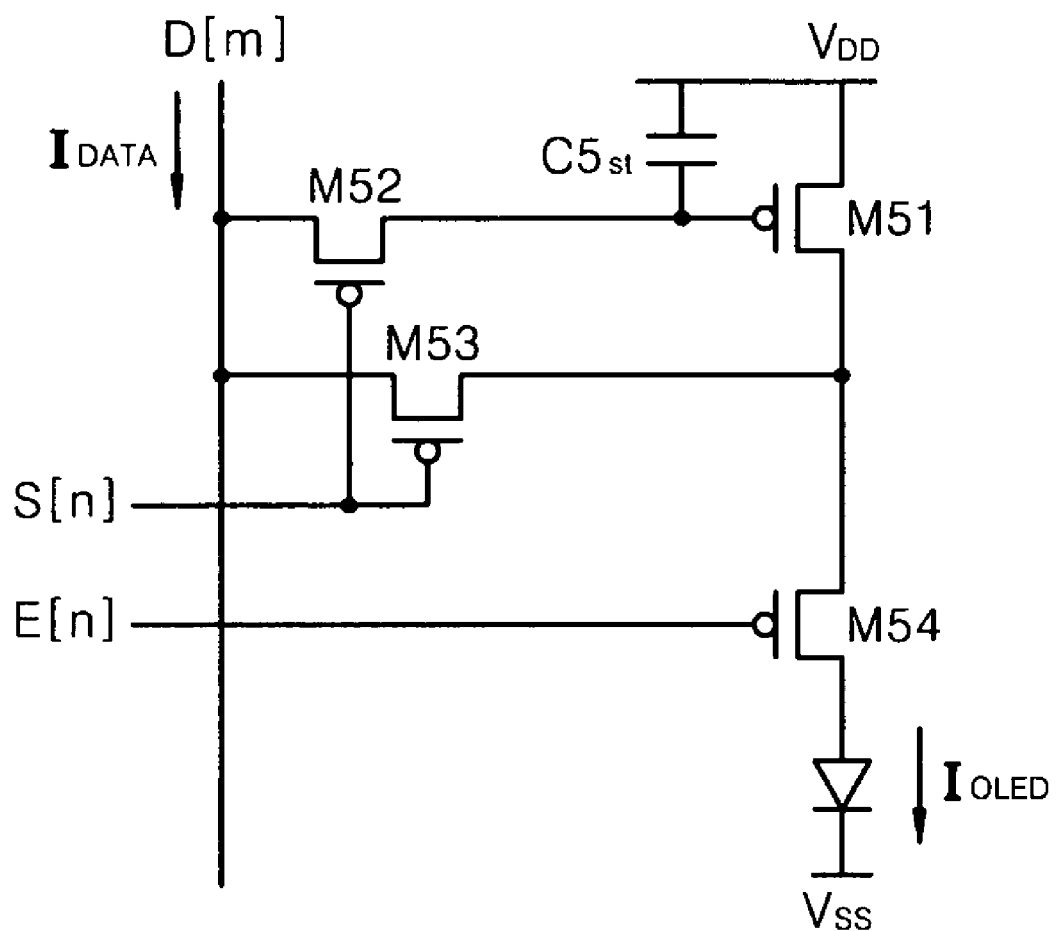
FIG. 5 is a circuit diagram of an embodiment of a pixel circuit shown in FIG. 4.

FIG. 5 is a circuit diagram of an embodiment of a pixel circuit P shown in FIG. 4. The pixel circuit P includes an OLED, a transistor M51, a first switching device M52, a second switching device M53, a third switching device M54, and a storage capacitor C5st. The transistor M51, the first switching device M52, the second switching device M53, and the third switching device M54 may be transistors of an identical channel type. As shown in FIG. 5, the transistor M51, the first switching device M52, the second switching device M53, and the third switching device M54 are all p-channel transistors.

The first switching device M52 is connected between a data line and a gate of the transistor M51 and applies a data signal D[m] from the data line (that is, a data current $I_{DATA}$) to the transistor M51 according to a selection signal S[n]. The second switching device M53 is connected between the data line and a drain of the transistor M51 and connects the transistor M51 in a diode form according to the selection signal S[n] of the selection scan line. A source of the transistor M51 is connected to a first voltage source VDD, and the drain thereof is also connected to the third switching device M54. The storage capacitor C5st is connected between the gate and the source of the transistor M51. The third switching device M54 is connected between the OLED and the transistor M51 and allows a driving current $I_{OLED}$ corresponding to a voltage between the gate and the source of the transistor M51 to flow into the OLED.

Figure 6:
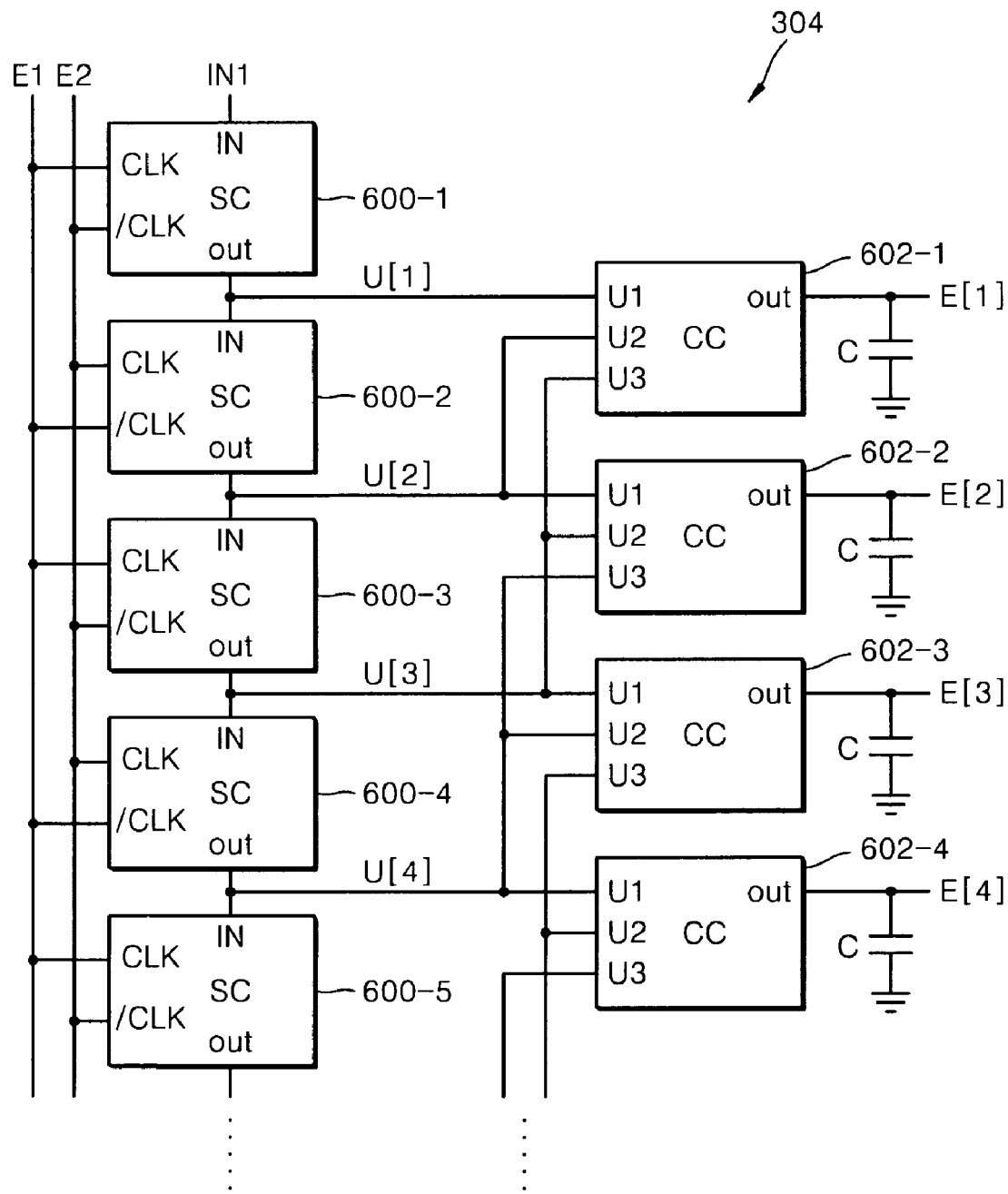
FIG. 6 is a block diagram of a first scan driving unit shown in FIG. 4.
Figure 7:
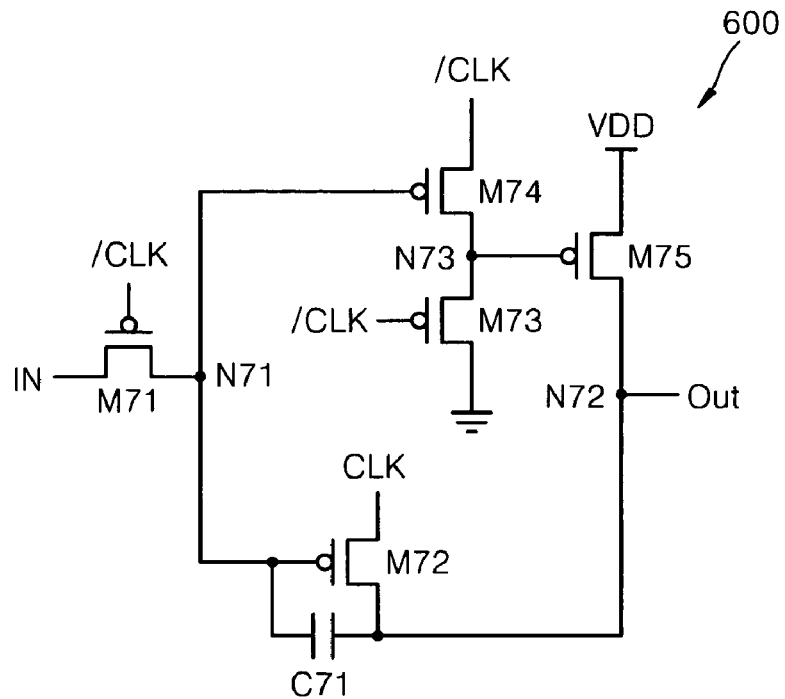
FIG. 7 is a circuit diagram of a scanning circuit shown in FIG. 6.
Figure 8:
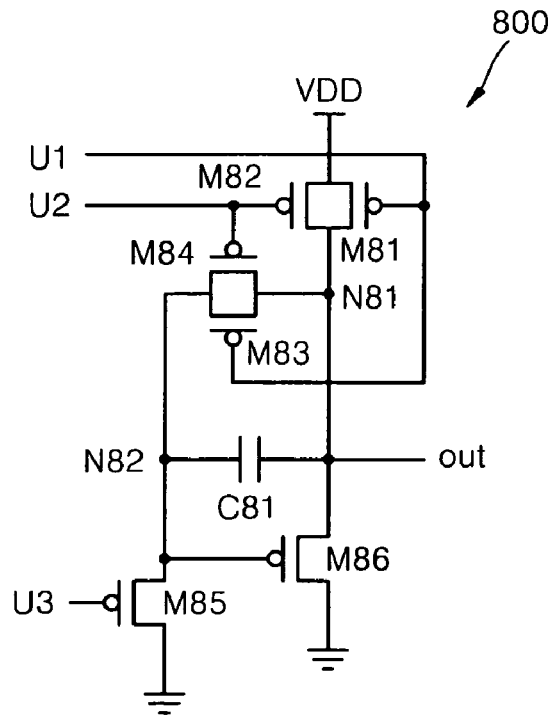
FIG. 8 is a circuit diagram of a conversion circuit shown in FIG. 6.
Figure 9:
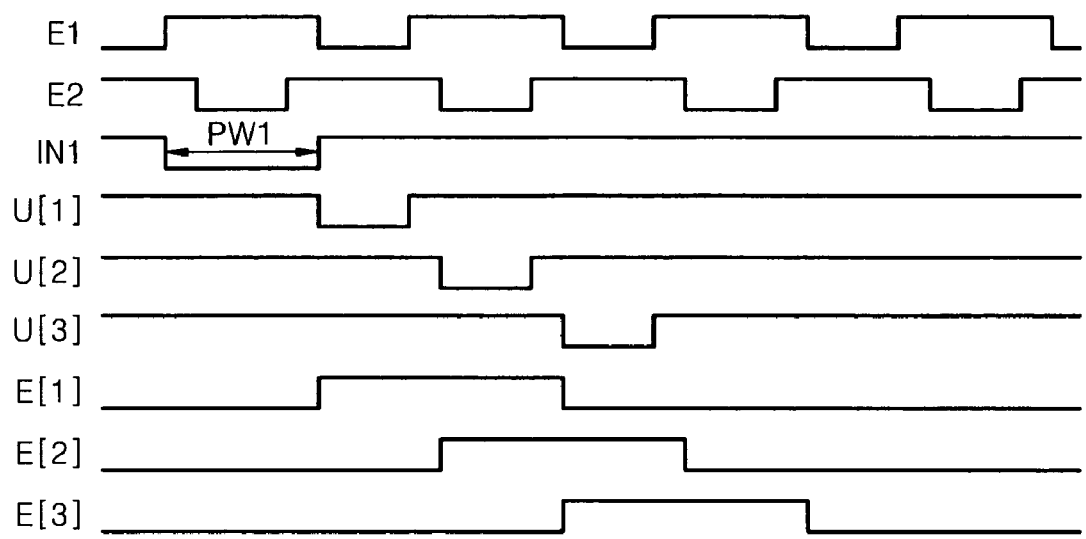
FIG. 9 is a waveform diagram of an example of signals applied to the scanning circuit of FIG. 7 and the conversion circuit of FIG. 8.

FIG. 6 is a block diagram of an embodiment of the first scan driving unit 304 shown in FIG. 4. FIG. 7 is a circuit diagram of an embodiment of a scanning circuit shown in FIG. 6. FIG. 8 is a circuit diagram of an embodiment of a conversion circuit shown in FIG. 6. FIG. 9 is a waveform diagram of an example of signals applied to the scanning circuit of FIG. 7 and the conversion circuit of FIG. 8.

Referring to FIGS. 6 through 9, to provide the emission signals E[n] to the corresponding emission scan lines, the first scan driving unit 304 includes scanning circuits (SCs) 600, the number of which is equal to the number of emission scan lines, and conversion circuits (CCs) 602, the number of which is equal to the number of emission scan lines. In a further embodiment, the first scan driving unit 304 includes a plurality of load capacitors C (see, for example, FIG. 6). Each of the load capacitors C is connected between a corresponding emission scan line of the emission scan lines and the second voltage source (i.e., GND).

An embodiment of the SC 600 is shown in FIG. 7. Referring to FIGS. 6 and 7, each of the SCs 600 receives an input signal IN, a clock signal CLK, and a clock bar signal /CLK and outputs a scan output signal out. A first SC 600-1 receives a first control signal E1 as the clock signal CLK, a second control signal E2 as the clock bar signal /CLK, and a scan input signal IN1 as the input signal IN and outputs a first scan output signal U[1] to a first CC 602-1. The first scan output signal U[1] serves as a first signal of the first CC 602-1. A second SC 600-2 receives the second control signal E2 as the clock signal CLK, the first control signal E1 as the clock bar signal /CLK, and the first scan output signal U[1] as the input signal IN and outputs a second scan output signal U[2] to the first CC 602-1 to serve as a second signal of the first CC 602-1 and to a second CC 602-2 to serve as a first signal of the second CC 602-2. A third SC 600-3 receives the first control signal E1 as the clock signal CLK, the second control signal E2 as the clock bar signal /CLK, and the second scan output signal U[2] as the input signal IN and outputs a third scan output signal U[3] to the first CC 602-1 to serve as a third signal of the CC 602-1, to the second CC 602-2 to serve as a second signal of the CC 602-2, and to a third CC 602-3 to serve as a first signal of the third CC 602-3. As described above, the first control signal E1 and the second control signal E2 are alternately applied as the clock signals CLK of the scanning circuits, and the second control signal E2 and the first control signal E1 are alternately applied as the clock bar signals /CLK of the scanning circuits.

When the input signal IN is enable (i.e., enable level or logic low), the clock signal CLK is disable (i.e., disable level or logic high), and the clock bar signal /CLK is enable (i.e., logic low), the SC 600 outputs a disable level as the scan output signal out. Then, when the input signal IN is disable, the clock signal CLK is enable, and the clock bar signal /CLK is disable, the SC 600 outputs an enable level as the scan output signal out. When the input signal IN is disable, the clock signal CLK is disable, and the clock bar signal /CLK is enable, the SC 600 outputs a disable level as the scan output signal out. Then, when the input signal IN is disable, the clock signal CLK is enable, and the clock bar signal /CLK is disable, the SC 600 outputs a disable level as the scan output signal out.

In order to perform the above-described operation, as shown in FIG. 7, each of the SCs 600 included in the first scan driving unit 304 of FIG. 6 includes a first transistor M71 for applying an input signal IN to a first node N71 in response to a clock bar signal /CLK, a second transistor M72 for applying a clock signal CLK to a second node N72 in response to a signal of (or at) the first node N71, a third transistor M73 for applying an enable level of the second voltage source (i.e., GND) to a third node N73 in response to the clock bar signal /CLK, a fourth transistor M74 for applying the clock bar signal /CLK to the third node N73 in response to the signal of the first node N71, and a fifth transistor M75 for applying a disable level of a first voltage source (i.e., VDD) to the second node N72 in response to a signal of the third node N73. A signal of the second node N72 serves as a scan output signal out.

In other words, a drain of the first transistor M71, having a gate to which the clock bar signal /CLK is applied and a source to which the input signal IN is applied, is electrically connected to respective gates of the second transistor M72 and the fourth transistor M74. A drain of the fourth transistor M74, having a source to which the clock bar signal /CLK is applied, is connected to a source of the third transistor M73. A drain of the third transistor M73, having a gate to which the clock bar signal /CLK is applied, is connected to the second voltage source, that is, GND. A drain of the second transistor M72, having a source to which the clock signal CLK is applied, is connected to a drain of the fifth transistor M75. The first voltage source VDD is connected to a source of the fifth transistor M75 having a gate electrically connected to a node between the drain of the fourth transistor M74 and a source of the third transistor M73, that is, to the third node N73. A node between a drain of the first transistor M71 and the gates of the fourth transistor M74 and the second transistor M72 is referred to as the first node N71. A node between the respective drains of the second transistor M72 and the fifth transistor M75 is referred to as the second node N72. A first capacitor C71 is connected between the gate and the drain of the second transistor M72. The first capacitor C71 may be either a separate capacitor or a parasitic capacitance (or capacitor) between the gate and the drain of the second transistor M72.

The first transistor M71, the second transistor M72, the third transistor M73, the fourth transistor M74, and the fifth transistor M75 may be all transistors of an identical channel type. Accordingly, the first transistor M71, the second transistor M72, the third transistor M73, the fourth transistor M74, and the fifth transistor M75 may be all p-channel transistors or n-channel transistors. Operations of the SC 600 will now be described in more detail on the assumption that the first transistor M71, the second transistor M72, the third transistor M73, the fourth transistor M74, and the fifth transistor M75 are all p-channel transistors.

In a first operation, when the clock signal CLK is disable, the clock bar signal /CLK is enable, and the input signal IN is enable, the first transistor M71 is turned on to apply an enable signal to the first node N71. The second transistor M72 and the fourth transistor M74 are turned on according to the enable signal of the first node N71. The third transistor M73 is turned on by the enable clock bar signal /CLK. Accordingly, a signal of the third node N73 is also enabled so that the fifth transistor M75 is turned on. The voltage of the first voltage source VDD, that is, a disable level, is transmitted to the second node N72. The scan output signal out has a disable level. A difference in potential between the enable level of the first node N71 and the disable level of the second node N72 is stored in the first capacitor C71, that is, a difference in potential between the first node N71 and the second node N72.

Then, in a second operation, when the clock signal CLK is enable, the clock bar signal /CLK is disable, and the input signal IN is disable, the first transistor M71 and the third transistor M73 are turned off because of the clock bar signal /CLK is disable. Accordingly, the first node N71 and the third node N73 are floated, so that the fifth transistor M75 is not turned on. The second transistor M72 is turned on by the difference in potential between the enable and disable levels that was stored in the first capacitor C71 during the first operation, so that the enable level of the clock signal CLK is transmitted to the second node N72. Accordingly, the scan output signal out has an enable level.

In a third operation, when the clock signal CLK is disable, the clock bar signal /CLK is enable, and the input signal IN is disable, the first transistor M71 and the third transistor M73 are turned on. A disable level, which is the input signal IN, is applied to the first node N71 by the first transistor M71, and the second transistor M72 and the fourth transistor M74 are turned off. Since the signal of the third node N73 is enabled by the ground voltage of the second voltage source GND, the fifth transistor M75 is turned on, and the disable signal (i.e., a logic high level) of the first voltage source VDD is transmitted to the second node N72. Accordingly, the scan output signal out has a disable level. Since the nodes at both ends of the first capacitor C71, namely, the first node N71 and the second node N72, are all disable (i.e., logic high), the first capacitor C71 stores the difference in potential between the first node N71 and the second node N72.

A fourth operation, during which the clock signal CLK is enable, the clock bar signal /CLK is disable, and the input signal IN is disable, is similar to the second operation. Since the clock bar signal /CLK is disable, the first transistor M71 and the third transistor M73 are turned off. Accordingly, the first node N71 and the third node N73 are floated, so that the fourth transistor M74 and the fifth transistor M75 are turned off. The difference in potential stored during the third operation remains stored in the first capacitor C71, but the first node N71 and the second node N72 are both disable, that is, logic high. Therefore, the second transistor M72 does not turn on. Accordingly, the scan output signal out has a disable level.

Each of the CCs 602 receives a first signal U1, a second signal U2 and a third signal U3 and outputs a conversion output signal out. The conversion output signal out is an emission signal. The first CC 602-1 receives the first scan output signal U[1] as the first signal U1, receives the second scan output signal U[2] as the second signal U2, receives the third scan output signal U[3] as the third signal U3, and outputs a first emission signal E[1] as the conversion output signal out. The second CC 602-2 receives the second scan output signal U[2] as the first signal U1, receives the third scan output signal U[3] as the second signal U2, receives a fourth scan output signal U[4] as the third signal U3, and outputs a second emission signal E[2] as the conversion output signal out. The third CC 602-3 receives the third scan output signal U[3] as the first signal U1, receives the fourth scan output signal U[4] as the second signal U2, receives a fifth scan output signal U[5] as the third signal U3, and outputs a third emission signal E[3] as the conversion output signal out. As described above, the CCs 602 sequentially receive scan output signals having sequential enable intervals (see FIG. 9, for example) via the first signal U1, the second signal U2, and the third signal U3.

An embodiment of the CC 602 that outputs a conversion output signal having a disable level when either the first signal U1 or the second signal U2 is enable and outputs a conversion output signal having an enable level when the third signal U3 is enable is shown in FIG. 8.

The CC 800 shown in FIG. 8 includes a first transistor M81 for applying a voltage of a first voltage source VDD to a first node N81 in response to the first signal U1, a second transistor M82 for applying the voltage of the first voltage source VDD to the first node N81 in response to the second signal U2, a third transistor M83 for applying a signal of the first node N81 to a second node N82 in response to the first signal U1, a fourth transistor M84 for applying the signal of the first node N81 to the second node N82 in response to the second signal U2, a first capacitor C81 for storing a difference in potential between the first node N81 and the second node N82, a fifth transistor M85 for applying a voltage of a second voltage source (e.g., GND) to the second node N82 in response to the third signal U3, and a sixth transistor M86 for applying the voltage of the second voltage source to the first node N81 in response to a signal of the second node N82. The signal of the first node N81 is the conversion output signal out, that is, an emission signal.

In other words, the first transistor M81 and the second transistor M82 are connected between the first voltage source VDD and the first node N81 and receive the first signal U1 and the second signal U2, respectively, via corresponding gates. The third transistor M83 and the fourth transistor M84 are connected between the first node N81 and the second node N82 and receive the first signal U1 and the second signal U2, respectively, via corresponding gates. The first capacitor C81 is connected between the first node N81 and the second node N82. The fifth transistor M85 is connected between the second voltage source (e.g., GND) and the second node N82 and receives the third signal U3 via a gate of the fifth transistor M85. The sixth transistor M86 is connected between the second voltage source and the first node N81 and receives the signal of the second node N82 via a gate of the sixth transistor M86.

Operations of the CC 800 will now be described. A first operation is performed when the first signal U1 is enable and the second signal U2 and the third signal U3 are disable. In the first operation, according to the enable first signal U1, the first transistor M81 and the third transistor M83 are turned on and the second transistor M82, the fourth transistor M84, the fifth transistor M85, and the sixth transistor M86 are turned off. Therefore, the voltage of the first voltage source VDD is transmitted to the first node N81 and the second node N82, so that the first node N81 and the second node N82 become disable. As a result, the emission signal becomes disable. The first capacitor C81 stores the difference in potential between the first node N81 and the second node N82.

A second operation is performed when the second signal U2 is enable and the first signal U1 and the third signal U3 are disable. In the second operation, according to the enable second signal U2, the second transistor M82 and the fourth transistor M84 are turned on and the first transistor M81, the third transistor M83, the fifth transistor M85, and the sixth transistor M86 are turned off. Therefore, the voltage of the first voltage source VDD is transmitted to the first node N81 and the second node N82, so that the first node N81 and the second node N82 become disable. As a result, the emission signal becomes disable. The first capacitor C1 stores the difference in potential between the first node N81 and the second node N82.

A third operation is performed when the third signal U3 is enable and the first signal U1 and the second signal U2 are disable. In the third operation, the first transistor M81, the second transistor M82, the third transistor M83, and the fourth transistor M84 are turned off. According to the enable third signal U3, the fifth transistor M85 is turned on, and the second node N82 becomes enable. Therefore, the sixth transistor M86 is also turned on, and consequently the first node N81 becomes enable. As a result, the emission signal is enabled. The first capacitor C1 stores the difference in potential between the first node N81 and the second node N82.

A fourth operation is performed when all of the first signal U1, the second signal U2, and the third signal U3 are disable. When the fourth operation is performed after the third operation, the first transistor M81, the second transistor M82, the third transistor M83, the fourth transistor M84, the fifth transistor M85, and the sixth transistor M86 are turned off. The signal of the first node N81 is enabled by the difference in potential stored in the first capacitor C81. As a result, the emission signal becomes enable.

FIG. 9 illustrates the first operation, the second operation, the third operation, and the fourth operation of the SC 600 and those of the CC 800. Particularly, when a scan input signal IN1 having a pulse width of PW1 is input as the input signal of the first SC 600-1, the first scan output signal U[1], the second scan output signal U[2], and the third scan output signal U[3] having sequential enable intervals are output. When the first scan output signal U[1], the second scan output signal U[2], and the third scan output signal U[3] are in turn input as the first signal U1, the second signal U2, and the third signal U3 of the first CC 602-1, an emission signal E[1] is output. According to the operations described above, emission signals E[2] and E[3] are also output. As shown in FIG. 9, emission signals E[1], E[2], and E[3] have sequential disable levels.

Figure 10:
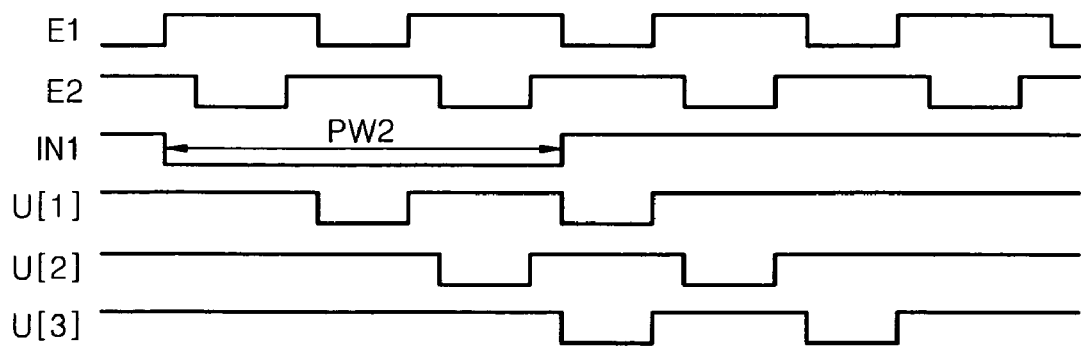
FIG. 10 is a waveform diagram of another example of signals applied to the scanning circuit of FIG. 7 and the conversion circuit of FIG. 8.

FIG. 10 is a waveform diagram of another example of signals applied to the SC 600 of FIG. 7 and the CC 800 of FIG. 8. The waveform diagram of FIG. 10 is different from the waveform diagram of FIG. 9 in view of the scan input signal IN1 which is the input signal of the first SC 600-1. The scan input signal IN1 of FIG. 10 has a pulse width of PW2, which is greater than the pulse width PW1 of the scan input signal IN1 of FIG. 9. As shown in FIG. 10, when the scan input signal IN1 (having the pulse width PW2) is applied to the first SC 600-1 as its input signal, the first scan output signal U[1], the second scan output signal U[2], and the third scan output signal U[3] each have two enable intervals. Accordingly, the first signal U1 or the second signal U2 and the third signal U3 may be both enabled, resulting in output of inaccurate emission signals by the CC 800.

In other words, when the first signal U1 and the third signal U3 are enable and the second signal U2 is disable, the first transistor M82, the third transistor M83, the fifth transistor M85, and the sixth transistor M86 are turned on, and the second transistor M82 and the fourth transistor M84 are turned off. Hence, a collision between an enable level and a disable level occurs in the first node N81, and thus the corresponding emission signal has transition levels between the disable levels and the enable levels. Accordingly, a problem is generated, in which the pulse widths of the disable levels of the emission signals cannot be controlled as the designer wants.

To address this problem, an embodiment of the present invention provides another example of a CC in which a fifth transistor M125 is not turned on when enabled first signal U1 and third signal U3 are input.

Figure 11:
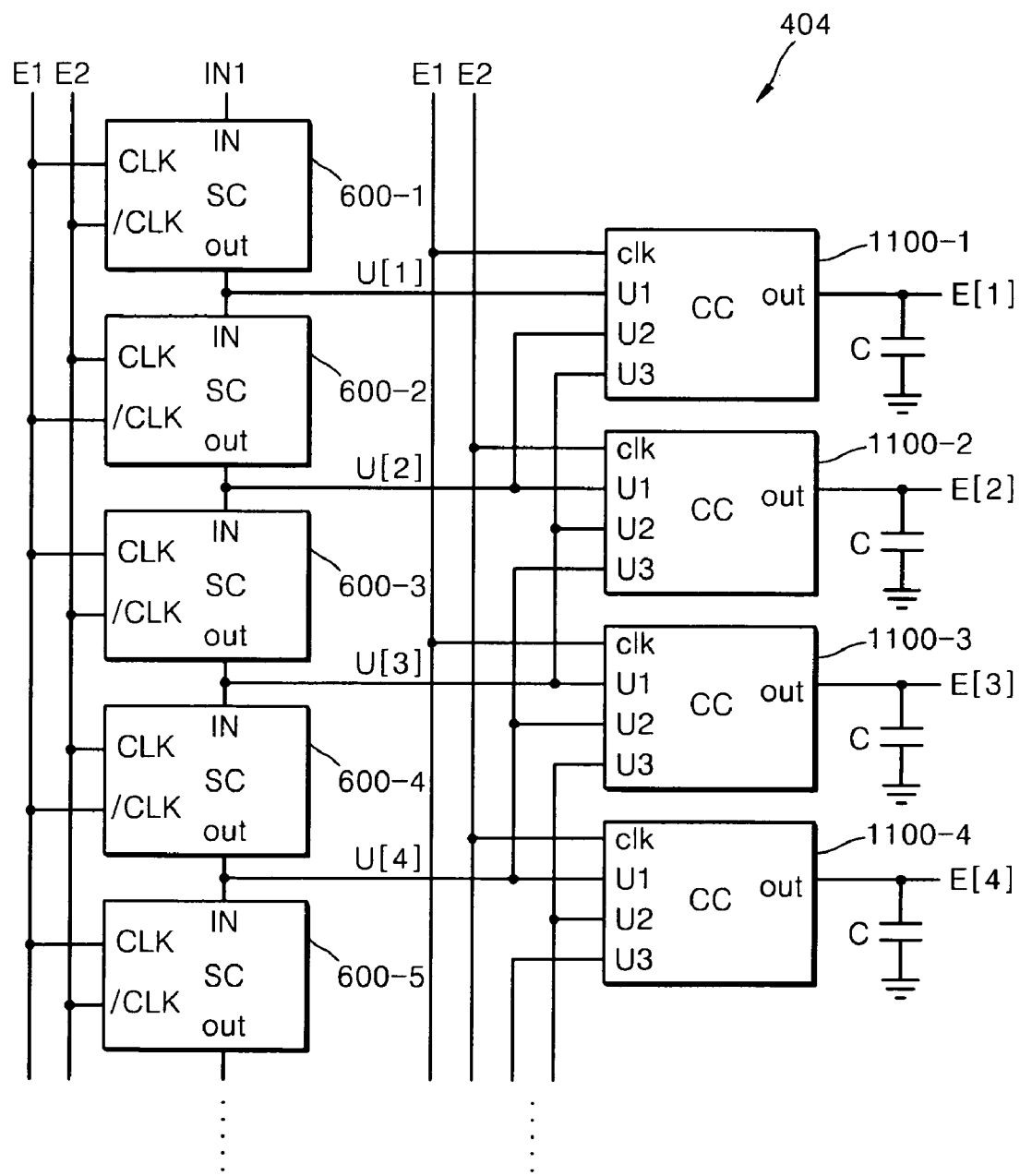
FIG. 11 illustrates a first scan driving unit included in an organic light emitting display device according to an embodiment of the present invention.
Figure 12:
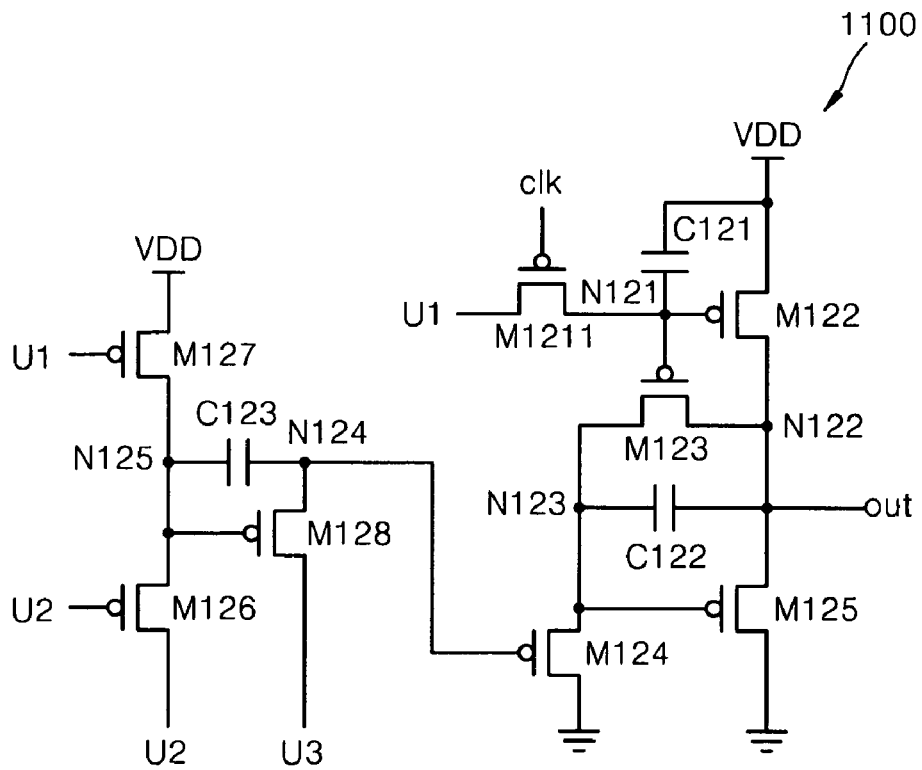
FIG. 12 is a circuit diagram of a conversion circuit shown in FIG. 11.
Figure 13:
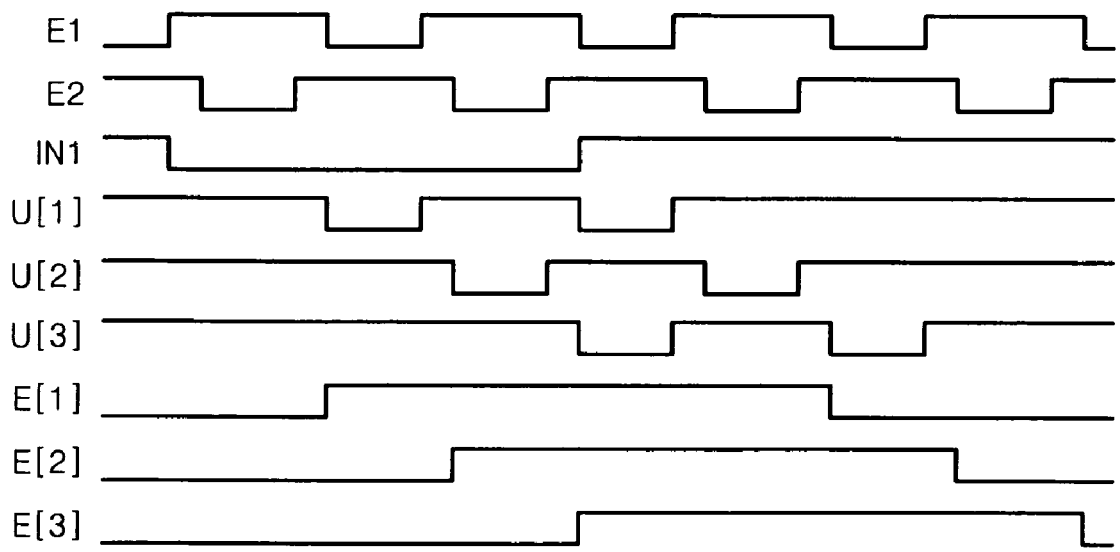
FIG. 13 is a waveform diagram of an example of signals of the first scan driving unit illustrated in FIGS. 11 and 12.

FIG. 11 illustrates an example of a first scan driving unit 404 included in an organic light emitting display device according to an embodiment of the present invention. FIG. 12 is a circuit diagram of a CC shown in FIG. 11. FIG. 13 is a waveform diagram of an example of signals applied to the first scan driving unit 404.

Referring to FIGS. 11 through 13, in contrast with the first scan driving unit 304 of FIG. 6, the first scan driving unit 404 includes CCs 1100 to each of which a clock signal clk is further applied. A first control signal E1 and a second control signal E2 alternate as the clock signals clk applied to the CCs 1100. In other words, the first control signal E1 is applied to a first CC 1100-1 as the clock signal clk, and the second control signal E2 is applied to a second CC 1100-2 as the clock signal clk.

Referring to FIG. 12, each of the CCs 1100 includes a first transistor M121 for applying a first signal U1 to a first node N121 in response to the clock signal clk, a first capacitor C121 for storing a difference in potential between the first node N121 and a first voltage source VDD, a second transistor M122 for applying a voltage of the first voltage source VDD to a second node N122 in response to a signal of the first node N121, a third transistor M123 for applying a signal of the second node N122 to a third node N123 in response to the signal of the first node N121, a fourth transistor M124 for applying a voltage of a second voltage source (e.g., GND) to the third node N123 in response to a signal of a fourth node N124, a second capacitor C122 for storing a difference in potential between the second node N122 and the third node N123, the fifth transistor M125 for applying the voltage of the second voltage source to the second node N122 in response to the signal of the third node N123, a sixth transistor M126 for applying a second signal U2 to a fifth node N125 in response to the second signal U2, a seventh transistor M127 for applying the voltage of the first voltage source VDD to the fifth node N125 in response to the first signal U1, an eighth transistor M128 for applying a third signal U3 to the fourth node N124 in response to a signal of the fifth node N125, and a third capacitor C123 for storing a difference in potential between the fourth node N124 and the fifth node N125. The signal of the second node N122 is a conversion output signal out, that is, an emission signal. The first transistor M121, the second transistor M122, the third transistor M123, the fourth transistor M124, the fifth transistor M125, the sixth transistor 126, the seventh transistor M127, and the eighth transistor M8 may be all transistors of an identical channel type. Accordingly, the first transistor M121, the second transistor M122, the third transistor M123, the fourth transistor M124, the fifth transistor M125, the sixth transistor 126, the seventh transistor M127, and the eighth transistor M128 may be all p-channel transistors or n-channel transistors. Operations of the CC 1100 will now be described on the assumption that the first transistor M121, the second transistor M122, the third transistor M123, the fourth transistor M124, the fifth transistor M125, the sixth transistor 126, the seventh transistor M127, and the eighth transistor M128 are all p-channel transistors.

In a first operation, when the clock signal clk and the first signal U1 are enable and the second signal U2 and the third signal U3 are disable, the first transistor M121, the second transistor M122, the third transistor M123 and the seventh transistor M127 are turned on, and the sixth transistor M126 and the eighth transistor M128 are turned off. The second node N122 is disable, but the fourth node N124 is floated. Hence, the fourth transistor M124 and the fifth transistor M125 are turned off, and thus the emission signal becomes disable. At this time, the difference in potential between the low level of the first signal U1 and a voltage of the first voltage source VDD is stored in the first capacitor C121.

In a second operation, when the second signal U2 is enable and the clock signal, the first signal U1 and the third signal U3 are disable, the sixth transistor M126 and the eighth transistor M128 are turned on and the second transistor 122 and the third transistor M123 are turned on by the difference in potential stored in the first capacitor C121. Since a signal of the fourth node N124 enters into the disable level of the third signal U3, the fourth transistor M124 and the fifth transistor M125 are turned off. As a result, the emission signal becomes disable. At this time, a difference in potential between the low level of the second signal U2 and the high level of the third signal U3 is stored in the third capacitor C123.

In a third operation, when the clock signal clk, the first signal U1 and the third signal U3 are enable and the second signal U2 is disable, the first transistor M121, the second transistor M122, the third transistor M123 and the seventh transistor M127 are turned on. The voltage of the first voltage source VDD is transmitted to the fifth node N125, so that a signal of the fourth node N4 becomes a disable level (or disable). Hence, the fourth transistor M124 and the fifth transistor M125 are turned off. A difference in potential between the enable level (or enable) of the first signal U1 and the voltage of the first voltage source VDD is stored in the first capacitor C121. The signal of the second node N122 becomes a disable level, so that the emission signal is disabled.

A fourth operation performed when the clock signal clk and the third signal U3 are enable and the first signal and the second signal U2 are disable is substantially the same as the second operation.

In a fifth operation, when the clock signal clk and the third signal U3 are enable and the first signal and the second signal U2 are disable, the first transistor M121 is turned on, and the eighth transistor M128 is turned on by the voltage stored in the third capacitor C123. Accordingly, the enable level of the third signal U3 is transmitted to the fourth node N124, and the fourth transistor M124 and the fifth transistor M125 are turned on. Hence, the signal of the second node N122 becomes an enable level, and consequently the emission signal is enabled. A difference in potential between the enable levels of the second node N122 and the third node N123 is stored in the second capacitor C122.

In a sixth operation, when all of the first signal U1, the second signal U2, and the third signal U3 are disable, the signal of the second node N2 is enabled by the low level stored in the second capacitor C122. As a result, the emission signal becomes enable.

Due to the use of the CC 1100 of FIG. 12, the pulse widths of the disable levels of the emission signals can be freely controlled.

Figure 14:
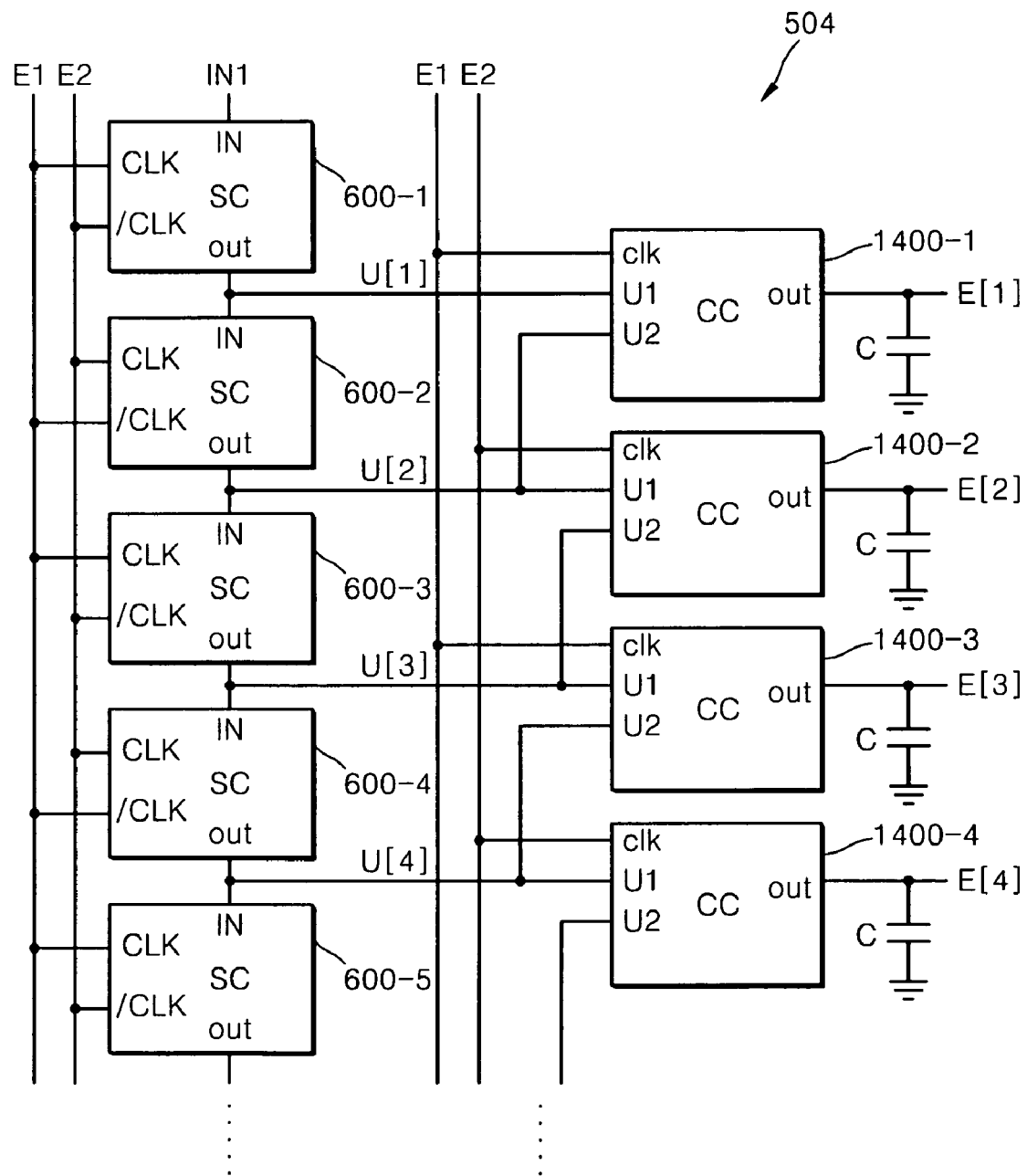
FIG. 14 illustrates a first scan driving unit included in an organic light emitting display device according to another embodiment of the present invention.
Figure 15:
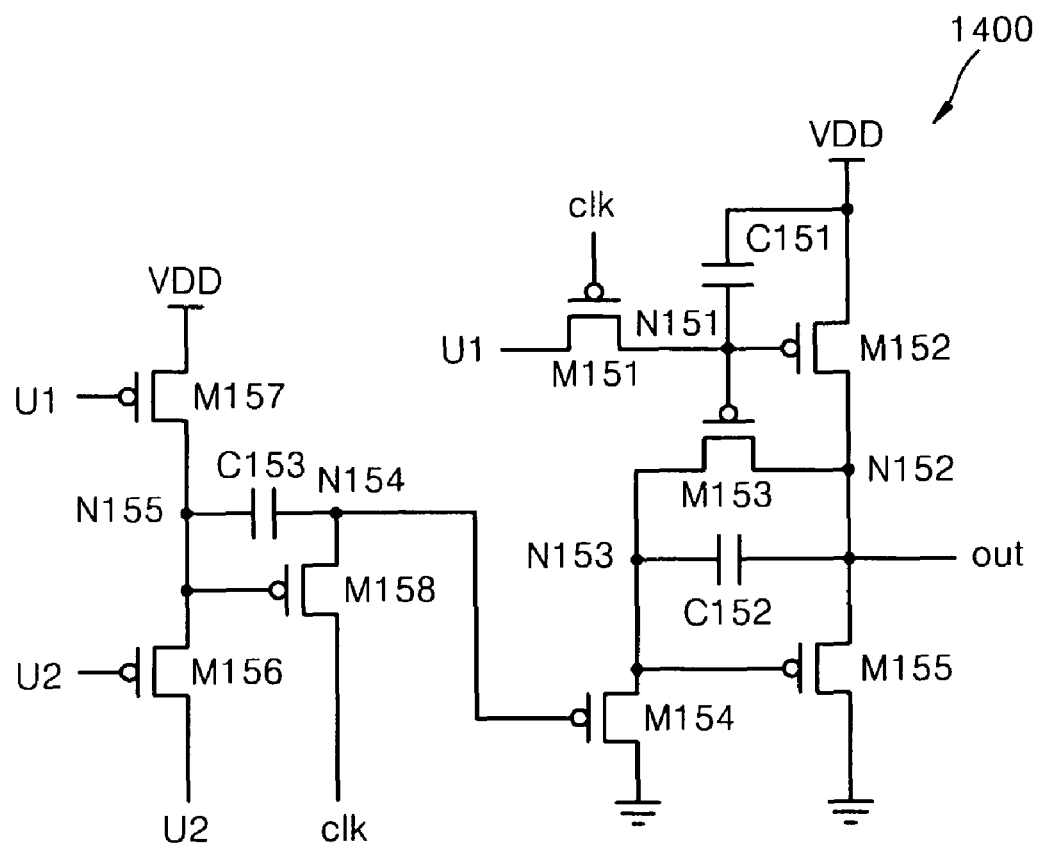
FIG. 15 is a circuit diagram of a conversion circuit shown in FIG. 14.

FIG. 14 illustrates another example of the first scan driving unit included in the organic light emitting display device of FIG. 11. FIG. 15 is a circuit diagram of a CC 1400 shown in FIG. 14.

Referring to FIG. 14, a first scan driving unit 504 includes CCs 1400 to each of which no third signals U3 are applied, in contrast with the first scan driving unit 404 of FIG. 11. A first control signal E1 and a second control signal E2 alternate as clock signals clk applied to the CCs 1400. In other words, the first control signal E1 is applied to a first CC 1400-1 as the clock signal clk, and the second control signal E2 is applied to a second CC 1400-2 as the clock signal clk. The signals applied to the CC 1400 are substantially the same as those is shown in FIG. 13.

Each of the CCs 1400 illustrated in FIG. 15 is similar to the CC 1100 of FIG. 12 except that a signal applied to a fourth node N154 in response to a signal of a fifth node N155 by an eighth transistor M158 is not the third signal U3 but the clock signal clk. The transistors of the CC 1400 operate in substantially the same way as the first through sixth operations of the CC 1100 of FIG. 12. The number of types of signals input to the CC 1400 of FIG. 15 and the number of CCs 1400 can be reduced. Like the CC 1100 of FIG. 12, the first transistor M151, the second transistor M152, the third transistor M153, the fourth transistor M154, the fifth transistor M155, the sixth transistor 156, the seventh transistor M157, and the eighth transistors M158 of the CC 1400 of FIG. 15 may be all transistors of an identical channel type. Accordingly, the first transistor M151, the second transistor M152, the third transistor M153, the fourth transistor M154, the fifth transistor M155, the sixth transistor 156, the seventh transistor M157, and the eighth transistor M158 of the CC 1400 of FIG. 15 may be all p-channel transistors or n-channel transistors.

Figure 16:
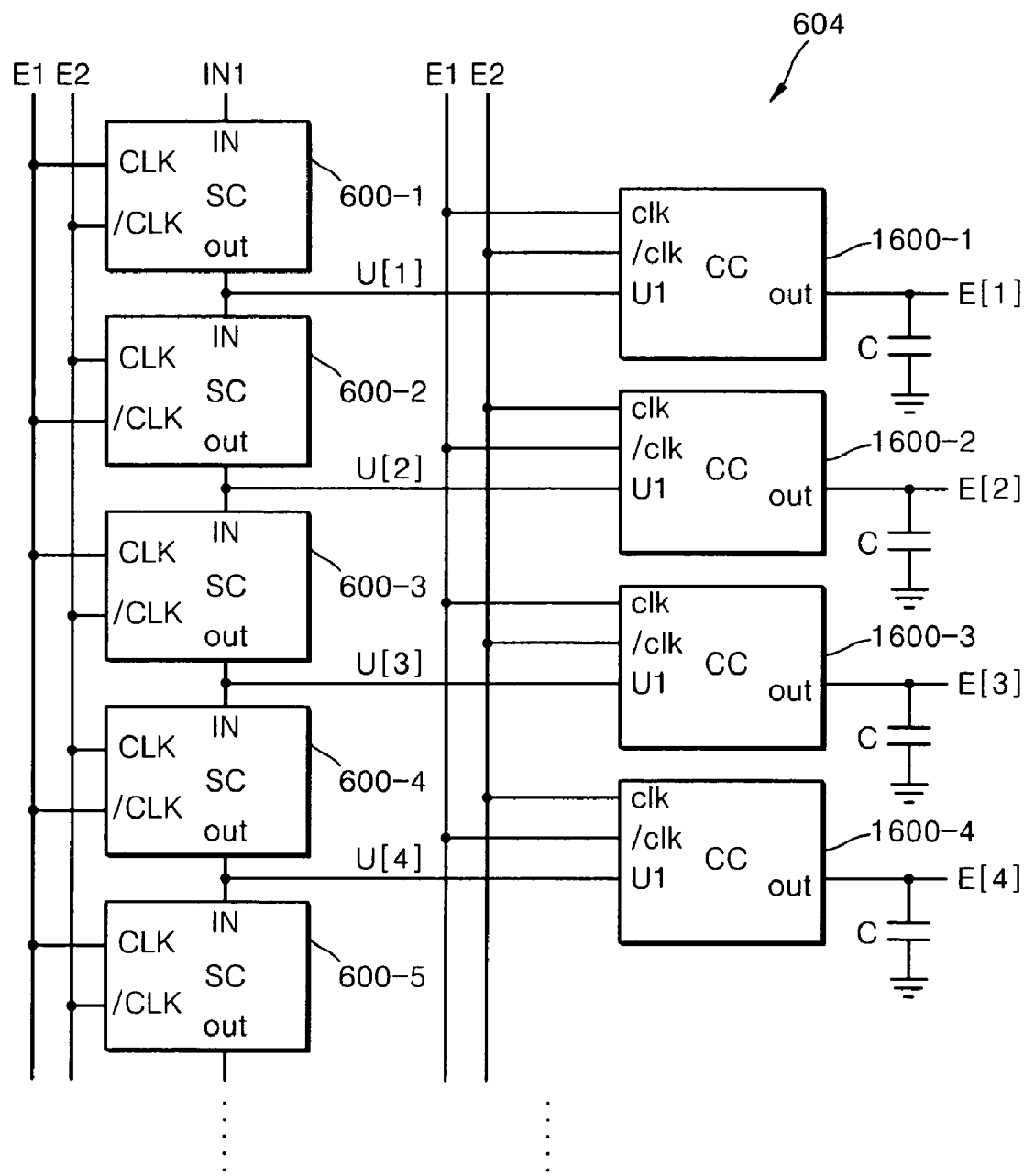
FIG. 16 illustrates a first scan driving unit included in an organic light emitting display device according to another embodiment of the present invention.
Figure 17:
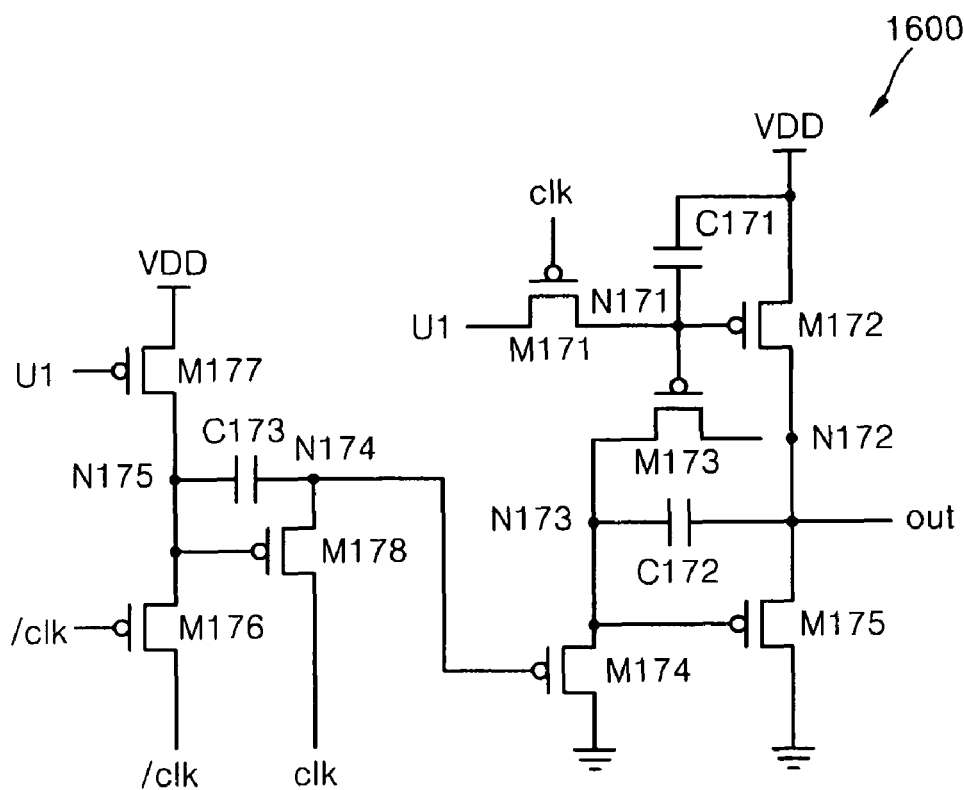
FIG. 17 is a circuit diagram of a conversion circuit shown in FIG. 16.

FIG. 16 illustrates another example of the first scan driving unit included in the organic light emitting display device of FIG. 11. FIG. 17 is a circuit diagram of a CC 1600 shown in FIG. 16.

Referring to FIG. 16, a first scan driving unit 604 includes CCs 1600 to each of which a clock signal clk, a clock bar signal /clk, and a first signal U1 are applied. A first control signal E1 is applied to a first CC 1600-1 as the clock signal clk, and a second control signal E2 is applied to the first CC 1600-1 as the clock bar signal /clk. The second control signal E2 is applied to a second CC 1600-2 as the clock signal clk, and the first control signal E1 is applied to the second CC 1600-2 as the clock bar signal /clk. The signals applied to the CC 1600 are substantially the same as those illustrated in FIG. 13.

Each of the CCs 1600 illustrated in FIG. 17 is similar to the CC 1100 of FIG. 15 except that, rather than the signal U2, the clock bar signal /clk is applied to the fifth node N175 in response not to the signal U2 but to the clock bar signal by a sixth transistor M176. The transistors of the CC 1600 operate in substantially the same way as the first through sixth operations of the CC 1100 of FIG. 12. The number of types of signals input to the CC 1600 of FIG. 17 and the number of CCs 1600 can be reduced. Like the CC 1100 of FIG. 12, the first transistor M171, the second transistor M172, the third transistor M173, the fourth transistor M174, the fifth transistor M175, the sixth transistor 176, the seventh transistor M177, and the eighth transistor M178 of the CC 1600 of FIG. 17 may be all transistors of an identical channel type. Accordingly, the first transistor M171, the second transistor M172, the third transistor M173, the fourth transistor M174, the fifth transistor M175, the sixth transistor 176, the seventh transistor M177, and the eighth transistor M178 of the CC 1600 of FIG. 17 may be all p-channel transistors or n-channel transistors.

Figure 18:
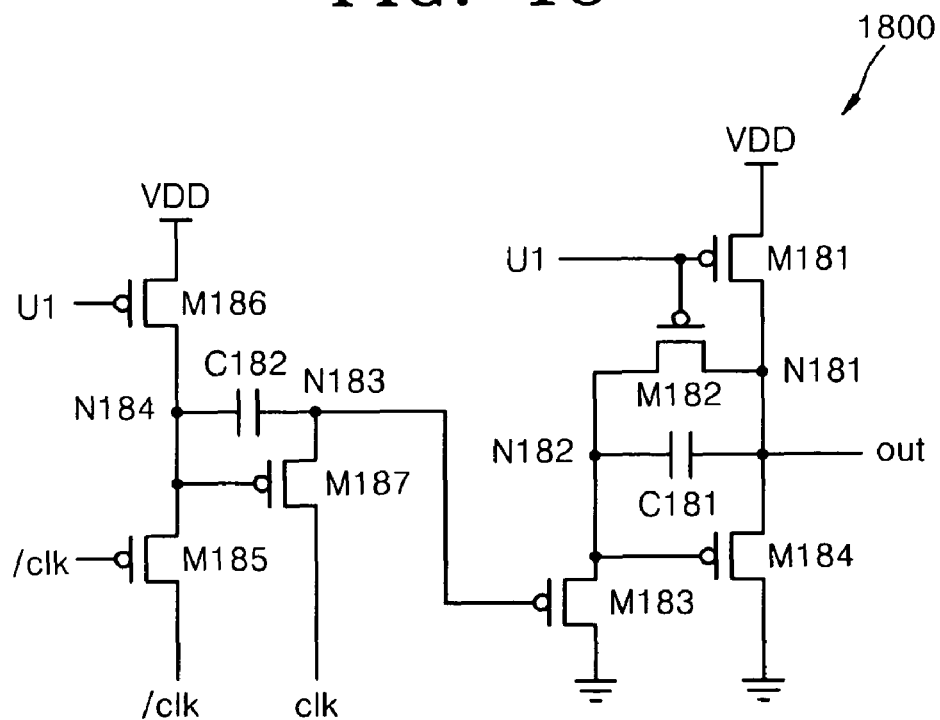
FIG. 18 is a circuit diagram of a modified embodiment of the conversion circuit shown in FIG. 16.

FIG. 18 is a circuit diagram of a modified example of the CC shown in FIG. 16. Referring to FIG. 18, a CC 1800 includes a first transistor M181 for applying a voltage of a first voltage source VDD to a first node N181 in response to a first signal U1, a second transistor M182 for applying a signal of the first node N181 to a second node N182 in response to the first signal U1, a third transistor M183 for applying a voltage of a second voltage source (e.g., GND) to the second node N182 in response to a signal of the third node N183, a first capacitor C181 for storing a difference in potential between the first node N181 and the second node N182, a fourth transistor M184 for applying the voltage of the second voltage source to the first node N181 in response to a signal of the second node N182, a fifth transistor M185 for applying the clock bar signal /clk to the fourth node N184 in response to the clock bar signal /clk, the sixth transistor M186 for applying the voltage of the first voltage source VDD to the fourth node N184 in response to the first signal U1, a seventh transistor M187 for applying the clock signal clk to the third node N183 in response to a signal of the fourth node N184, and a second capacitor C182 for storing a difference in potential between the third node N183 and the fourth node N184. The signal of the first node N181 is a conversion output signal out, that is, an emission signal. The first transistor M181, the second transistor M182, the third transistor M183, the fourth transistor M184, the fifth transistor M185, the sixth transistor 186, and the seventh transistor M187 may be all transistors of an identical channel type. Accordingly, the first transistor M181, the second transistor M182, the third transistor M183, the fourth transistor M184, the fifth transistor M185, the sixth transistor 186, and the seventh transistor M187 may be all p-channel transistors or n-channel transistors. Operations of the CC 1800 will now be described with reference to FIG. 18 on the assumption that the first transistor M181, the second transistor M182, the third transistor M183, the fourth transistor M184, the fifth transistor M185, the sixth transistor 186, and the seventh transistor M187 are all p-channel transistors.

In a first operation, when the clock signal clk and the first signal U1 are enable and the clock bar signal /clk is disable, the first transistor M181, the second transistor M182, and the sixth transistor M186 are turned on. The first node N181 is enabled, but the third node N183 is floated. Hence, the emission signal becomes disable. At this time, a disable level is stored in the first capacitor C181.

In a second operation, when the clock bar signal /clk is enable and the clock signal and the first signal U1 are disable, the fifth transistor M185 and the seventh transistor M187 are turned on, and the enable level of the clock bar signal /clk and the disable level of the clock signal clk are stored in the second capacitor C182. Since a signal of the third node N183 has a disable level, the third transistor M183 and the fourth transistor M184 are turned off. The signal of the first node N181 enters into the disable level stored in the first capacitor C181, and thus the emission signal becomes disable.

In a third operation, when the clock signal clk and the first signal U1 are enable and the clock bar signal /clk is disable, the first transistor M181, the second transistor M182, and the sixth transistor M186 are turned on. The first node N181 is disabled, but the third node N183 is floated. Hence, the emission signal has a disable level. The first capacitor C181 stores a disable level.

A fourth operation performed when the clock bar signal /clk is enable and the clock signal clk and the first signal U1 are disable is substantially the same as the second operation.

A fifth operation is performed when the clock signal clk is enable and the first signal U1 and the clock bar signal /clk are disable. In the fifth operation, because of the difference in potential stored in the second capacitor C182, the seventh transistor M187 is turned on, and the signal of the third node N183 enters into the enable level of the clock signal clk. Accordingly, the third transistor M183 and the fourth transistor M184 are turned on, and the signal of the first node N181 becomes an enable level. As a result, the emission signal is enabled. An enable level is stored in the first capacitor C181.

Due to the use of the CC 1800 of FIG. 18, the pulse widths of the disable levels of the emission signals can be freely controlled.

Figure 19:
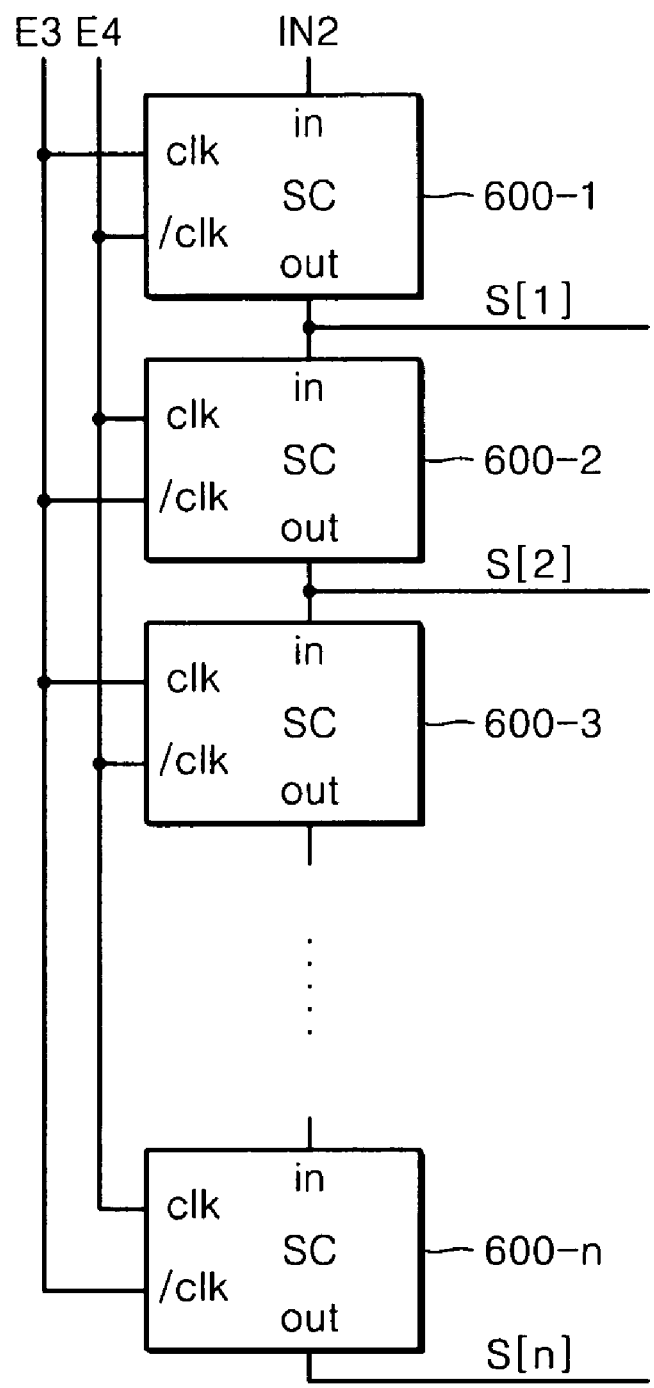
FIG. 19 illustrates a second scan driving unit included in each of the organic light emitting display devices of FIGS. 11, 14, 16, and 18.
Figure 20:
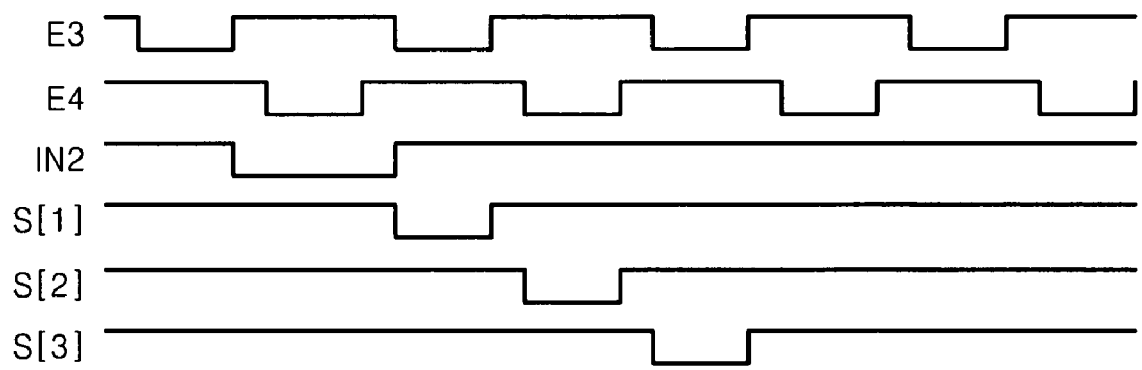
FIG. 20 is a waveform diagram of an example of signals of the second scan driving unit illustrated in FIG. 19.

FIG. 19 illustrates an example of a second scan driving unit included in the organic light emitting display device of FIG. 4. FIG. 20 is a waveform diagram of an example of signals applied to the second scan driving unit illustrated in FIG. 19.

Referring to FIG. 19, a second scan driving unit 306 includes a plurality of selection circuits 600. Each of the selection circuits 600 receives an input signal in, a clock signal clk, and a clock bar signal /clk and outputs a selection output signal out. For example, a first selection circuit 600-1 receives a third control signal E3 as the clock signal clk, a fourth control signal E4 as the clock bar signal /clk, and a selection input signal IN2 as the input signal in, and outputs a first selection output signal S[1]. Then, a second selection circuit 600-2 receives the fourth control signal E4 as the clock signal clk, the third control signal E3 as the clock bar signal /clk, and the first selection output signal S[1] as the input signal in, and outputs a second selection output signal S[2]. In other words, the third and fourth control signals E3 and E4 are alternately applied as the clock signals clk of the selection circuits 600, and the third and fourth control signals E3 and E4 are alternately applied as the clock bar signals /clk of the selection circuits 600.

When the input signal in is enable, the clock signal clk is disable (i.e., disable level or logic high), and the clock bar signal /clk is enable (i.e., enable level or logic low), the selection circuit 600 outputs a selection output signal out having a disable level. Thereafter, when the input signal in is disable, the clock signal clk is enable, and the clock bar signal /clk is disable, the selection circuit 600 outputs a selection output signal out having an enable level. When the input signal in is disable, the clock signal clk is disable, and the clock bar signal /clk is enable, the selection circuit 600 outputs a selection output signal out having a disable level. Thereafter, when the input signal in is disable, the clock signal clk is enable, and the clock bar signal /clk is disable, the selection circuit 600 outputs a selection output signal out having a disable level.

The selection circuits 600 included in the second scan driving unit 306 are substantially the same as the SCs 600 of FIG. 7, so the structures and operations thereof will not be described herein.

In an organic light emitting display device according to embodiments of the present invention as described above, a first scan driving unit for applying emission signals to pixel circuits for driving organic light emitting elements is made up of scanning circuits each including a plurality of transistors of an identical channel type and conversion circuits each including a plurality of transistors of an identical channel type. Thus, the manufacturing costs of the organic light emitting display device can be reduced. In addition, a second scan driving unit for applying selection signals to the pixel circuits is made up of selection circuits each including a plurality of transistors of an identical channel type. Thus, the manufacturing costs of the organic light emitting display device can be reduced.

Also, the pulse widths of disable levels of the emission signals output via the conversion circuits can be freely and stably controlled by adjusting the pulse width of an enable level of a scan input signal applied to a first scanning circuit of the first scan driving unit.

Furthermore, the manufacturing costs of the organic light emitting display device can be reduced by reducing the number of signals input to each of the conversion circuits, and the number of conversion circuits can also be reduced.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
a plurality of data lines adapted to transmit a plurality of data signals;
a plurality of selection scan lines adapted to transmit a plurality of selection signals;
a plurality of emission scan lines adapted to transmit a plurality of emission signals;
a plurality of pixel circuits arranged at regions defined by the data lines and the selection scan lines; and
a first scan driving unit adapted to output the emission signals, wherein:

the first scan driving unit comprises a plurality of conversion circuits, each of the conversion circuits comprising a plurality of conversion circuit transistors of an identical channel type, being adapted to receive a first signal, a second signal, a third signal and a conversion circuit clock signal, and being adapted to output a conversion output signal as a respective emission signal of the emission signals, when the conversion circuit clock signal and the first signal are enable, the conversion output signal is disable, when the conversion circuit clock signal, the first signal and the third signal are disable and the second signal is enable, the conversion output signal is disable, when the conversion circuit clock signal, the first signal and the third signal are enable, the conversion output signal is disable, and when the first signal is disable and the conversion circuit clock signal and the third signal are enable, the conversion output signal is enable.

2. The organic light emitting display device of claim 1, wherein:

the first scan driving unit further comprises a plurality of scan circuits, each of the scan circuits comprising a plurality of scan circuit transistors of an identical channel type, being adapted to receive an input signal, a scan circuit clock signal, and a clock bar signal, and being adapted to output a scan output signal, when the scan circuit clock signal is enable after the input signal is enable and the scan circuit clock signal is disable, the scan output signal is enable, and scan output signals having sequential enable intervals are sent to a conversion circuit of the conversion circuits respectively as the first signal, the second signal, and the third signal.

3. The organic light emitting display device of claim 2, wherein:

the plurality of scan circuit transistors of each of the scan circuits comprises:

a first scan circuit transistor adapted to apply the input signal to a first node in response to the clock bar signal;

a second scan circuit transistor having a second scan circuit transistor first electrode and a second scan circuit transistor gate electrode and being adapted to apply the scan circuit clock signal to a second node in response to a signal of the first node;

a third scan circuit transistor adapted to apply a voltage of a second voltage source to a third node in response to the clock bar signal;

a fourth scan circuit transistor adapted to apply the clock bar signal to the third node in response to the signal of the first node; and a fifth scan circuit transistor adapted to apply a disable level of a first voltage source to the second node in response to a signal of the third node, and each of the scan circuits further comprises a first scan circuit capacitor electrically connected between the second scan circuit transistor gate electrode and the second scan circuit transistor first electrode, the first scan circuit capacitor being adapted to store a difference in potential between an enable level of the signal of the first node and a disable level of the signal of the second node.

4. The organic light emitting display device of claim 2, wherein:
  a first scan circuit of the scan circuits is adapted to receive a scan input signal as the input signal, to receive a first control signal as the scan circuit clock signal, and to receive a second control signal as the clock bar signal and is further adapted to output a first scan output signal of the scan output signals, and
  a second scan circuit of the scan circuits is adapted to receive the first scan output signal as the input signal, to receive the second control signal as the scan circuit clock signal, and to receive the first control signal as the clock bar signal and is further adapted to output a second scan output signal of the scan output signals.

5. The organic light emitting display device of claim 1, wherein:
  the plurality of conversion circuit transistors of each of the conversion circuits comprises:
  a first conversion circuit transistor adapted to apply the first signal to a first node in response to the conversion circuit clock signal;
  a second conversion circuit transistor adapted to apply a voltage of a first voltage source to a second node in response to a signal of the first node;
  a third conversion circuit transistor adapted to apply a signal of the second node to a third node in response to the signal of the first node;
  a fourth conversion circuit transistor adapted to apply a voltage of a second voltage source to the third node in response to a signal of a fourth node;
  a fifth conversion circuit transistor adapted to apply the voltage of the second voltage source to the second node in response to a signal of the third node;
  a sixth conversion circuit transistor adapted to apply the second signal to a fifth node in response to the second signal;
  a seventh conversion circuit transistor adapted to apply the voltage of the first voltage source to the fifth node in response to the first signal; and
  an eighth conversion circuit transistor adapted to apply the third signal to the fourth node in response to a signal of the fifth node,
  each of the conversion circuits further comprises:
  a first capacitor adapted to store a difference in potential between the first node and the first voltage source;
  a second capacitor adapted to store a difference in potential between the second node and the third node; and
  a third capacitor adapted to store a difference in potential between the fourth node and the fifth node, and
  the signal of the second node is the conversion output signal.

6. The organic light emitting display device of claim 5, further comprising a plurality of load capacitors, each of the load capacitors being connected between a corresponding emission scan line of the emission scan lines and the second voltage source.

7. The organic light emitting display device of claim 5, wherein the second voltage source is a ground terminal.

8. The organic light emitting display device of claim 1, further comprising a second scan driving unit adapted to output the selection signals,
  wherein:
  the second scan driving unit comprises a plurality of selection circuits,
  each of the selection circuits comprising a plurality of selection circuit transistors of an identical channel type, being adapted to receive a selection circuit input signal, a selection circuit clock signal, and a selection circuit clock bar signal, and further being adapted to output a selection output signal as a respective selection signal of the selection signals, and
  when the selection circuit clock signal is enable after the selection circuit input signal is enable and the selection circuit clock signal is disable, the selection output signal is enable.

9. The organic light emitting display device of claim 8, wherein:
  the plurality of selection circuit transistors comprises:
  a first selection circuit transistor adapted to apply the selection circuit input signal to a first node in response to the selection circuit clock bar signal;
  a second selection circuit transistor having a second selection circuit transistor first electrode and a second selection circuit transistor gate electrode and being adapted to apply the selection circuit clock signal to a second node in response to a signal of the first node;
  a third selection circuit transistor adapted to apply a voltage of a second voltage source to a third node in response to the selection circuit clock bar signal;
  a fourth selection circuit transistor adapted to apply the selection circuit clock bar signal to the third node in response to the signal of the first node; and
  a fifth selection circuit transistor adapted to apply a disable level of a first voltage source to the second node in response to a signal of the third node, and
  each of the selection circuits further comprises a first selection circuit capacitor electrically connected between the second selection circuit transistor gate electrode and the second selection circuit transistor first electrode, the first selection circuit capacitor being adapted to store a difference in potential between an enable level of the signal of the first node and a disable level of a signal of the second node.

10. The organic light emitting display device of claim 8, wherein:
  a first selection circuit of the selection circuits is adapted to receive a selection input signal as the selection circuit input signal, to receive a third control signal as the selection circuit clock signal, and to receive a fourth control signal as the selection circuit clock bar signal and is further adapted to output a first selection output signal of the selection signals, and
  a second selection circuit of the selection circuits is adapted to receive the first selection output signal as the selection circuit input signal, to receive the fourth control signal as the selection circuit clock signal, and to receive the third control signal as the selection circuit clock bar signal and is further adapted to output a second selection output signal of the selection signals.

11. The organic light emitting display device of claim 1, wherein:
  a first conversion circuit of the conversion circuits is adapted to receive a first control signal as the conversion circuit clock signal and is further adapted to output a first emission output signal of the emission signals, and
  a second conversion circuit of the conversion circuits is adapted to receive a second control signal as the conversion circuit clock signal and is further adapted to output a second emission output signal of the emission signals.

12. The organic light emitting display device of claim 1, wherein the pixel circuits are adapted to transmit the data signals in response to the selection signals, are adapted to store the data signals as third voltages, are adapted to transmit driving currents corresponding to the third voltages in response to the emission signals, and are adapted to drive organic light emitting diodes adapted to emit lights in accordance with the driving currents.

13. The organic light emitting display device of claim 12, wherein each of the pixel circuits comprises:
    an organic light emitting diode of the organic light emitting diodes;
    a driving transistor for supplying a driving current of the driving currents used to drive the organic light emitting diode, the driving transistor having a gate electrode and a first electrode;
    a first switching device for applying a data signal of the data signals from a corresponding data line of the data lines to the driving transistor in response to a corresponding selection signal of the selection signals;
    a second switching device for connecting the driving transistor in a diode form in response to the selection signal;
    a first storage unit electrically connected between the first electrode and the gate electrode of the driving transistor; and
    a third switching device for applying the driving current from the driving transistor to the organic light emitting diode in response to a corresponding emission signal of the emission signals received from a corresponding emission scan line of the emission scan lines.

14. An organic light emitting display device comprising:
    a plurality of data lines adapted to transmit a plurality of data signals;
    a plurality of selection scan lines adapted to transmit a plurality of selection signals;
    a plurality of emission scan lines adapted to transmit a plurality of emission signals;
    a plurality of pixel circuits arranged at regions defined by the data lines and the selection scan lines; and
    a first scan driving unit adapted to output the emission signals,
    wherein:
        the first scan driving unit comprises a plurality of conversion circuits, each of the conversion circuits comprising a plurality of conversion circuit transistors of an identical channel type, being adapted to receive a first signal, a second signal, and a conversion circuit clock signal, and being adapted to output a conversion output signal as a respective emission signal of the emission signals,
        when the conversion circuit clock signal and the first signal are enable, the conversion output signal is disable,
        when the conversion clock signal and the first signal are disable and the second signal is enable, the conversion output signal is disable, and
        when the first signal is disable and the conversion circuit clock signal is enable, the conversion output signal is enable.

15. The organic light emitting display device of claim 14, wherein:
    the first scan driving unit further comprises a plurality of scan circuits, each of the scan circuits comprising a plurality of scan circuit transistors of an identical channel type, being adapted to receive an input signal, a scan circuit clock signal, and a clock bar signal, and being adapted to output a scan output signal,
    when the scan circuit clock signal is enable after the input signal is enable and the scan circuit clock signal is disable, the scan output signal is enable, and
    scan output signals having sequential enable intervals are sent to a conversion circuit of the conversion circuits respectively as the first signal and the second signal.

16. The organic light emitting display device of claim 14, wherein:
    the plurality of conversion circuit transistors of each of the conversion circuits comprises:
    a first conversion circuit transistor adapted to apply the first signal to a first node in response to the conversion circuit clock signal;
    a second conversion circuit transistor adapted to apply a voltage of a first voltage source to a second node in response to a signal of the first node;
    a third conversion circuit transistor adapted to apply a signal of the second node to a third node in response to the signal of the first node;
    a fourth conversion circuit transistor adapted to apply a voltage of a second voltage source to the third node in response to a signal of a fourth node;
    a fifth conversion circuit transistor adapted to apply the voltage of the second voltage source to the second node in response to a signal of the third node;
    a sixth conversion circuit transistor adapted to apply the second signal to a fifth node in response to the second signal;
    a seventh conversion circuit transistor adapted to apply the voltage of the first voltage source to the fifth node in response to the first signal; and
    an eighth conversion circuit transistor adapted to apply the conversion circuit clock signal to the fourth node in response to a signal of the fifth node, and
    each of the conversion circuits further comprises:
    a first capacitor adapted to store a difference in potential between the first node and the first voltage source;
    a second capacitor adapted to store a difference in potential between the second node and the third node; and
    a third capacitor adapted to store a difference in potential between the fourth node and the fifth node, and
    the signal of the second node is the conversion output signal.

17. An organic light emitting display device comprising:
    a plurality of data lines adapted to transmit a plurality of data signals;
    a plurality of selection scan lines adapted to transmit a plurality of selection signals;
    a plurality of emission scan lines adapted to transmit a plurality of emission signals;
    a plurality of pixel circuits arranged at regions defined by the data lines and the selection scan lines; and
    a first scan driving unit adapted to output the emission signals,
    wherein:
        the first scan driving unit comprises a plurality of conversion circuits, each of the conversion circuits comprising a plurality of conversion circuit transistors of an identical channel type, being adapted to receive a first signal, a conversion circuit clock signal, and a clock bar signal, and being adapted to output a conversion output signal as a respective emission signal of the emission signals,
        when the conversion circuit clock signal and the first signal are enable, the conversion output signal is disable,
        when the conversion circuit clock signal and the first signal are disable and the clock bar signal is enable, the conversion output signal is disable, and
        when the first signal is disable and the conversion circuit clock signal is enable, the conversion output signal is enable.

18. The organic light emitting display device of claim 17, wherein:
    the first scan driving unit further comprises a plurality of scan circuits, each of the scan circuits comprising a plurality of scan circuit transistors of an identical channel type, being adapted to receive an input signal, a scan circuit clock signal, and a clock bar signal, and being adapted to output a scan output signal, when the scan circuit clock signal is enable after the input signal is enable and the scan circuit clock signal is disable, the scan output signal is enable, and the scan output signal is sent to a conversion circuit of the conversion circuits as the first signal.

19. The organic light emitting display device of claim 17, wherein:

the plurality of conversion circuit transistors of each of the conversion circuits comprises:

a first conversion circuit transistor adapted to apply the first signal to a first node in response to the conversion circuit clock signal;

a second conversion circuit transistor adapted to apply a voltage of a first voltage source to a second node in response to a signal of the first node;

a third conversion circuit transistor adapted to apply a signal of the second node to a third node in response to the signal of the first node;

a fourth conversion circuit transistor adapted to apply a voltage of a second voltage source to the third node in response to a signal of a fourth node;

a fifth conversion circuit transistor adapted to apply the voltage of the second voltage source to the second node in response to a signal of the third node;

a sixth conversion circuit transistor adapted to apply the clock bar signal to a fifth node in response to the clock bar signal;

a seventh conversion circuit transistor adapted to apply the voltage of the first voltage source to the fifth node in response to the first signal;

an eighth conversion circuit transistor adapted to apply the conversion circuit clock signal to the fourth node in response to a signal of the fifth node; and each of the conversion circuits further comprises:

a first capacitor adapted to store a difference in potential between the first node and the first voltage source;

a second capacitor adapted to store a difference in potential between the second node and the third node; and a third capacitor adapted to store a difference in potential between the fourth node and the fifth node, and the signal of the second node is the conversion output signal.

20. The organic light emitting display device of claim 17, wherein:

a first conversion circuit of the conversion circuits is adapted to receive a first control signal as the conversion circuit clock signal and to receive a second control signal as the clock bar signal and is further adapted to output a first emission signal of the emission output signals, and a second conversion circuit of the conversion circuits is adapted to receive the second control signal as the conversion circuit clock signal and to receive the first control signal as the clock bar signal and is further adapted to output a second emission signal of the emission signals.

21. An organic light emitting display device comprising:

a plurality of data lines adapted to transmit a plurality of data signals;

a plurality of selection scan lines adapted to transmit a plurality of selection signals;

a plurality of emission scan lines adapted to transmit a plurality of emission signals;

a plurality of pixel circuits arranged at regions defined by the data lines and the selection scan lines; and a first scan driving unit adapted to output the emission signals, wherein:

the first scan driving unit comprises a plurality of conversion circuits, each of the conversion circuits comprising a plurality of conversion circuit transistors of an identical channel type, being adapted to receive a first signal, a conversion circuit clock signal, and a clock bar signal, and being adapted to output a conversion output signal as a respective emission signal of the emission signals, when the first signal is enable, the conversion output signal is disable, when the conversion circuit clock signal and the first signal are disable and the clock bar signal is enable, the conversion output signal is disable, and when the first signal is disable and the conversion circuit clock signal is enable, the conversion output signal is enable.

22. The organic light emitting display device of claim 21, wherein:

the first scan driving unit further comprises a plurality of scan circuits, each of the scan circuits comprising a plurality of scan circuit transistors of an identical channel type, being adapted to receive an input signal, a scan circuit clock signal, and a clock bar signal, and being adapted to output a scan output signal, when the scan circuit clock signal is enable after the input signal is enable and the scan circuit clock signal is disable, the scan output signal is enable, and the scan output signal is sent to a conversion circuit of the conversion circuits as the first signal.

23. The organic light emitting display device of claim 21, wherein:

the plurality of conversion circuit transistors of each of the conversion circuits comprises:

a first conversion circuit transistor adapted to apply a voltage of a first voltage source to a first node in response to the first signal;

a second conversion circuit transistor adapted to apply a signal of the first node to a second node in response to the first signal;

a third conversion circuit transistor adapted to apply a voltage of a second voltage source to the second node in response to a signal of a third node;

a fourth conversion circuit transistor adapted to apply the voltage of the second voltage source to the first node in response to a signal of the second node;

a fifth conversion circuit transistor adapted to apply the clock bar signal to a fourth node in response to the clock bar signal;

a sixth conversion circuit transistor adapted to apply the voltage of the first voltage source to the fourth node in response to the first signal; and a seventh conversion circuit transistor adapted to apply the conversion circuit clock signal to the third node in response to a signal of the fourth node, and each of the conversion circuits further comprises:

a first capacitor adapted to store a difference in potential between the first node and the second node; and a second capacitor adapted to store a difference in potential between the third node and the fourth node, and the signal of the first node is the conversion output signal.

* * * * *

UNITED STATES PATENT AND TRADEMARK OFFICE
CERTIFICATE OF CORRECTION

PATENT NO.       : 7,825,881 B2                                                    Page 1 of 1
APPLICATION NO.  : 11/698713
DATED            : November 2, 2010
INVENTOR(S)      : Dong-Yong Shin It is certified that error appears in the above-identified patent and that said Letters Patent is hereby corrected as shown below:

In the Claims

| | |
|---|---|
| Column 25, Claim 20, line 53 | Delete "first emission signal of the emission output signals," |
| | Insert -- first emission output signal of the emission signals -- |
| Column 25, Claim 20, line 58 | Delete "second emission signal" |
| | Insert -- second emission output signal -- |

Signed and Sealed this
Sixth Day of March, 2012

David J. Kappos
*Director of the United States Patent and Trademark Office*